(12) United States Patent
Chang et al.

(10) Patent No.: US 10,529,386 B2
(45) Date of Patent: Jan. 7, 2020

(54) MEMORY CONTROL CIRCUIT WITH DISTRIBUTED ARCHITECTURE

(71) Applicant: SanDisk Technologies LLC, Plano, TX (US)

(72) Inventors: Albert Chang, Santa Clara, CA (US); Sung-En Wang, San Jose, CA (US); Khin Htoo, Sunnyvale, CA (US); Supraja Sundaresan, San Jose, CA (US); Matt Chen, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/879,735

(22) Filed: Jan. 25, 2018

(65) Prior Publication Data

US 2018/0358057 A1 Dec. 13, 2018

Related U.S. Application Data

(60) Provisional application No. 62/617,042, filed on Jan. 12, 2018, provisional application No. 62/518,593, filed on Jun. 13, 2017.

(51) Int. Cl.
*G11C 5/14* (2006.01)
*G11C 7/06* (2006.01)

(52) U.S. Cl.
CPC ............... *G11C 5/147* (2013.01); *G11C 7/062* (2013.01)

(58) Field of Classification Search
CPC ........... G11C 5/147; G11C 5/063; G11C 7/12; G11C 11/1653
USPC ............................................. 365/189.09, 207
See application file for complete search history.

(56) References Cited

U.S. PATENT DOCUMENTS

| | | | |
|---|---|---|---|
| 6,614,295 B2 * | 9/2003 | Tsuchi | H03F 3/505 327/541 |
| 9,083,232 B1 | 7/2015 | Agarwal | |
| 9,911,481 B1 | 3/2018 | Alam et al. | |
| 2002/0101775 A1* | 8/2002 | Nojiri | G11C 11/5642 365/207 |
| 2007/0206427 A1* | 9/2007 | Hirobe | G11C 5/147 365/189.09 |
| 2008/0117674 A1 | 5/2008 | Lee | |
| 2009/0273998 A1* | 11/2009 | Mu | G11C 7/062 365/205 |
| 2010/0029234 A1 | 2/2010 | Joos et al. | |
| 2011/0298541 A1 | 12/2011 | Shi | |

* cited by examiner

*Primary Examiner* — Vu A Le
(74) *Attorney, Agent, or Firm* — Foley & Lardner LLP

(57) ABSTRACT

Disclosed is a device including a distributed controller and a common controller. The distributed controller includes a first circuit to generate an output voltage according to a control signal. The common controller includes a common feedback loop coupled to the distributed controller. The common feedback loop includes an amplifier circuit to generate the control signal, and a second circuit coupled to the amplifier circuit. The second circuit replicates the first circuit and stabilizes the control signal.

6 Claims, 13 Drawing Sheets

MEMORY CONTROL CIRCUIT WITH DISTRIBUTED ARCHITECTURE

CROSS-REFERENCE TO RELATED APPLICATIONS

The present application claims priority to U.S. Provisional Application No. 62/617,042 filed on Jan. 12, 2018, and U.S. Provisional Application No. 62/518,593 filed on Jun. 13, 2017, each of which is incorporated by reference herein in its entirety.

BACKGROUND

The following description is provided to assist the understanding of the reader. None of the information provided or references cited is admitted to be prior art.

The operation of memory devices includes the application of voltages or currents to memory cells. Writing data to the memory cells or reading the stored data includes applying different voltages at different phases. For example, various phases of writing data in a resistive memory device may include a set phase, a reset phase, a verification phase, a standby phase, etc. A bias control circuit may bias different components of the memory cells at corresponding voltages during different phases. To ensure correct operations of the memory devices, voltages from the bias control circuit may be settled within a settling time period during each phase. Increase in the settling time may cause delays in the operation speed of the memory devices.

SUMMARY

Various embodiments are related to a device including a distributed controller and a common controller. The distributed controller includes a first circuit to generate an output voltage according to a control signal. The common controller includes a common feedback loop coupled to the distributed controller. The common feedback loop includes an amplifier circuit to generate the control signal, and a second circuit coupled to the amplifier circuit. The second circuit replicates the first circuit and stabilizes the control signal.

In one or more embodiments, the distributed controller includes a local feedback loop to stabilize the output voltage. The local feedback loop may be configured to source or sink current to a corresponding memory cell while the second circuit stabilizes the control signal.

In one or more embodiments, the first circuit of the distributed controller includes an input terminal coupled to an output of the amplifier circuit to receive the control signal, an output terminal to output the output voltage, and a monitoring terminal. The distributed controller is configured to automatically enable or disable current through the output terminal according to a voltage at the monitoring terminal. The second circuit of the common feedback loop may include an input terminal coupled to the output of the amplifier circuit, and the input terminal of the first circuit, and an output terminal coupled to an input of the amplifier circuit. The second circuit may include a current source, an input transistor coupled to the current source in series, the input transistor having a gate terminal coupled to the input terminal of the first circuit, and a source terminal coupled to the output terminal of the second circuit, and a switch transistor coupled to the input transistor in parallel and coupled to the current source in series.

In one or more embodiments, the first circuit further includes a switch transistor coupled to the monitoring terminal, a diode connected transistor having a gate terminal coupled to the switch transistor, and a mirroring transistor coupled to an input transistor and a current source in series. The mirroring transistor may have a gate terminal coupled to the gate terminal of the diode connected transistor. The distributed controller may further include a self-controlled current sink. The self-controlled current sink may include a P-type transistor, and a control switch. The control switch may be configured to selectively couple the output terminal of the first circuit to a source terminal of the P-type transistor in response to the voltage at the monitoring terminal satisfying a first predetermined voltage, and decouple the output terminal of the first circuit from the source terminal of the P-type transistor in response to the voltage at the monitoring terminal not satisfying the first predetermined voltage. While the source terminal of the P-type transistor is coupled to the output terminal of the first circuit, the P-type transistor may be configured to sink current from the output terminal of the first circuit in response to a voltage at the output terminal being over a second predetermined voltage.

In one or more embodiments, the amplifier circuit is configured to output one of at least three voltage levels.

In one or more embodiments, the amplifier circuit includes a shared load circuit, and a plurality of differential sensing circuits coupled to each other in parallel. Each of the plurality of differential sensing circuits may be coupled to the shared load circuit in series.

Various embodiments are related to a device including a current source, an input transistor coupled to the current source in series, a switch transistor coupled to the input transistor in parallel and coupled to the current source in series, a diode connected transistor having a gate terminal coupled to the switch transistor, and a mirroring transistor coupled to the input transistor and the current source in series. The mirroring transistor has a gate terminal coupled to the gate terminal of the diode connected transistor. A voltage at a source terminal of the input transistor is supplied to a corresponding memory cell.

In one or more embodiments, the input transistor includes a drain terminal coupled to the current source and the switch transistor, and a gate terminal to receive a control signal. The input transistor may change the voltage at the source terminal by changing a voltage at the drain terminal of the input transistor and subsequently changing a voltage at the gate terminal of the diode connected transistor according the control signal. The device may further include a P-type transistor and a control switch. The control switch may be configured to couple the source terminal of the input transistor to a source terminal of the P-type transistor in response to the voltage at the drain terminal of the input transistor being over a first predetermined voltage, and decouple the source terminal of the input transistor from the source terminal of the P-type transistor in response to the voltage at the source terminal of the input transistor being below the first predetermined voltage. While the source terminal of the P-type transistor is coupled to the source terminal of the input transistor, the P-type transistor may be configured to sink current from the source terminal of the input transistor in response to the voltage at the source terminal of the input transistor being over a second predetermined voltage.

In one or more embodiments, the device further includes an amplifier circuit having an output coupled to the gate terminal of the input transistor. The amplifier circuit may generate the control signal.

In one or more embodiments, the device further includes an additional current source, an additional input transistor coupled to the additional current source in series, the additional input transistor having a source terminal coupled to an input of the amplifier circuit, an additional switch transistor coupled to the additional input transistor in parallel and coupled to the additional current source in series, an additional diode connected transistor having a gate terminal coupled to the additional switch transistor, and an additional mirroring transistor coupled to the additional input transistor and the additional current source in series, the additional mirroring transistor having a gate terminal coupled to the gate terminal of the additional diode connected transistor.

In one or more embodiments, the amplifier circuit is configured to output one of at least three voltage levels. The amplifier circuit may include a shared load circuit, and a plurality of differential sensing circuits coupled to each other in parallel, each of the plurality of differential sensing circuits coupled to the shared load circuit in series.

Various embodiments disclosed herein are related to a method comprising receiving a control signal at a gate terminal of an input transistor. The method further includes coupling, by a control switch, a P-type transistor to a source terminal of the input transistor in response to a voltage at a drain terminal of the input transistor satisfying a first predetermined voltage. The method further includes sinking, by the P-type transistor, current at the source terminal of the input transistor until a voltage at the source terminal of the input transistor is below a second predetermined voltage.

The foregoing summary is illustrative and is not intended to be in any way limiting. In addition to the illustrative aspects, embodiments, and features described above, further aspects, embodiments, and features will become apparent by reference to the following drawings and the detailed description.

Figure 1:
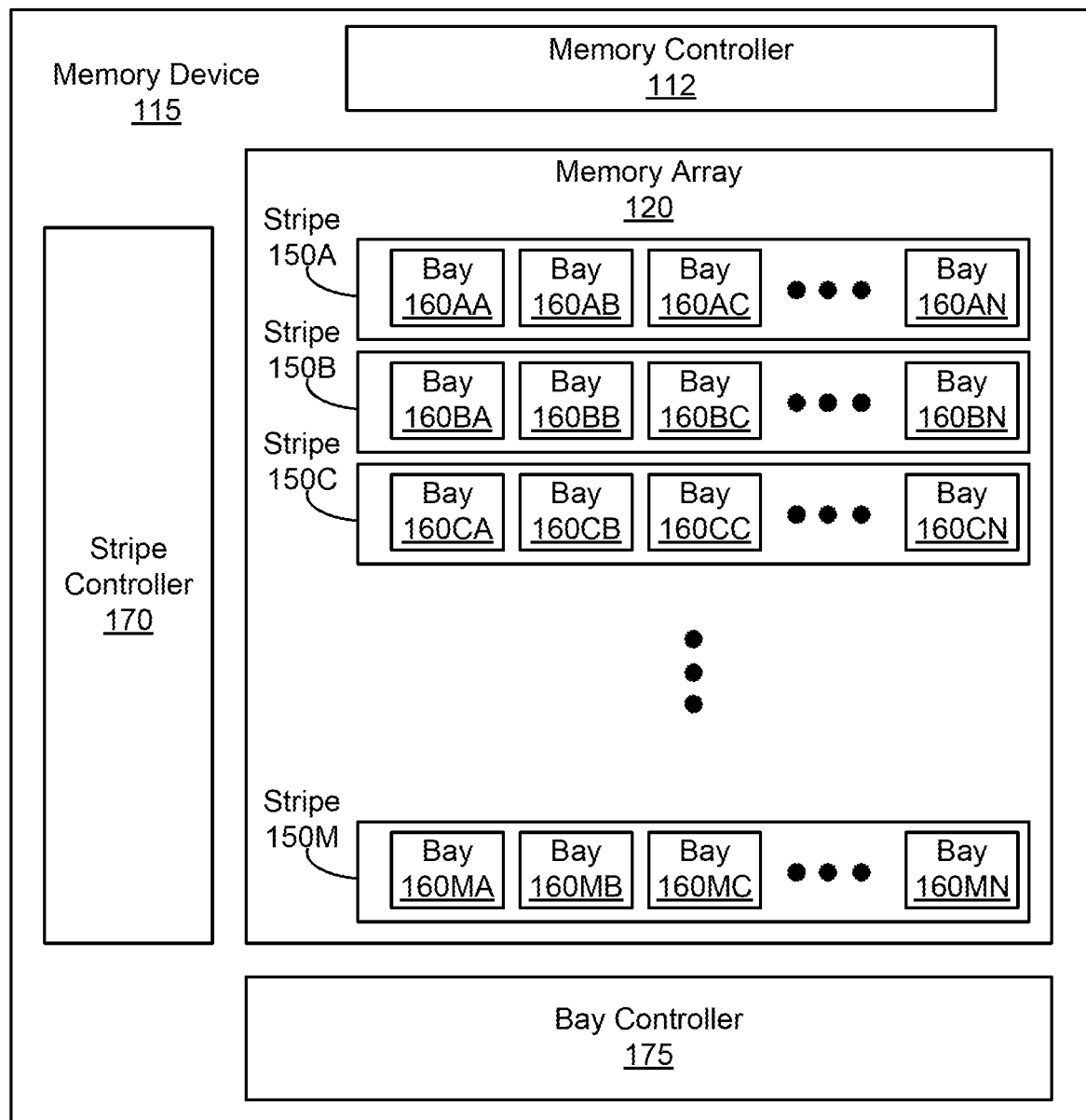
FIG. 1 is a block diagram of a memory device according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments disclosed herein are related to distributed drivers and a common controller to control voltages or currents applied to memory cells. Distributed drivers may provide voltages or currents to corresponding memory cells. A distributed driver (also referred to as "a distributed controller" herein) may be any circuit coupled to corresponding memory cells to provide one or more voltages or currents to the memory cells. The distributed driver may receive a control signal, and generate the one or more voltages or currents according to the control signal. The control signal is a signal indicative of a target voltage or a target current to be provided to memory cells. A common controller is a circuit that generates a control signal to control the distributed drivers. In one aspect, the common controller is coupled to and provides a control signal to each of a plurality of distributed drivers, and each of the distributed drivers receives the control signal from the common control signal and drives a respective set of memory cells. In such an implementation, a common controller is coupled to a plurality of distributed drivers, but each distributed driver is coupled to a single, common controller. The common controller may include a circuit that replicates the distributed driver or a portion of the distributed driver, and generates the control signal according to the circuit replicating the distribute driver or the portion of the distributed driver.

Advantageously, the disclosed distributed drivers and the common controller improve accuracy and speed of operation of the memory cells. In one aspect, writing data to or reading data from the memory cells includes applying varying voltages, sourcing currents or sinking currents. When there is a large change in voltages or current applied to the memory cells, a control signal may be affected, for example, through capacitive coupling or Miller effect. The circuit replicating a distributed driver or a portion of the distributed driver may be part of a feedback loop to regulate the control signal. Hence, the circuit replicating a distributed driver or a portion of the distributed driver allows the effect (e.g., capacitive coupling) of the large change in the voltages or current applied to the memory cells on the control signal to be reduced. Accordingly, varying level of voltages or current can be applied to memory cells with improved accuracy and speed.

FIG. 1 is a block diagram of one embodiment of a memory device 115. The memory device 115, in various embodiments, may be disposed in a computing device. In one embodiment, the memory device 115 includes a memory controller 112, a stripe controller 170, a bay controller 175, and the memory array 120. These components operate together to receive electronic data from a host processor (not shown), store the electronic data, and output the stored data to the host processor. In other embodiments, the memory device 115 includes more, fewer, or different components than shown in FIG. 1.

The memory array 120 is a component that stores electronic data. In one aspect, the memory array 120 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory array 120 includes a plurality of memory cells divided into bays 160 and stripes 150. A stripe 150 is a group of bays 160, where a bay 160 is a group of memory cells. The memory cells can be formed from passive and/or active elements, in any combinations. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may also be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In one embodiment, a stripe controller 170 controls a stripe 150 of bays 160, while a bay controller 175 controls each bay 160 individually. Each of the stripe controller 170 and the bay controller 175 may be implemented as a field programmable gate array, application specific integrated circuit, or a combination of them. Detailed implementations and operations of the stripe controller 170 and the bay controller 175 are described below with respect to FIGS. 3 through 10 below.

The memory controller 112 is an interface circuit that interfaces with the external host processor and internal components of the memory device 115 (e.g., the stripe controller 170 and the bay controller 175). The memory controller 112 may be coupled to the host processor through a bus. In addition, the memory controller 112 may be coupled to the stripe controller 170 and the bay controller 175 through conductive wires or traces on a printed circuit board or a flexible circuit board. For the writing operation, the memory controller 112 may receive electronic data to be stored, a target address of the memory array 120, and an instruction to store the electronic data from the host processor. In response to the instruction to store the electronic data, the memory controller 112 may configure the stripe controller 170 and the bay controller 175 to store the electronic data at the target address. For the reading operation, the memory controller 112 may receive a target address of the memory array 120, and an instruction to read the electronic data stored by memory cells associated with the target address from the host processor. In response to the instruction to read, the memory controller 112 configures the stripe controller 170 and the bay controller 175 to retrieve the electronic data stored by the target address and to output the retrieved data to the host processor.

Figure 2:
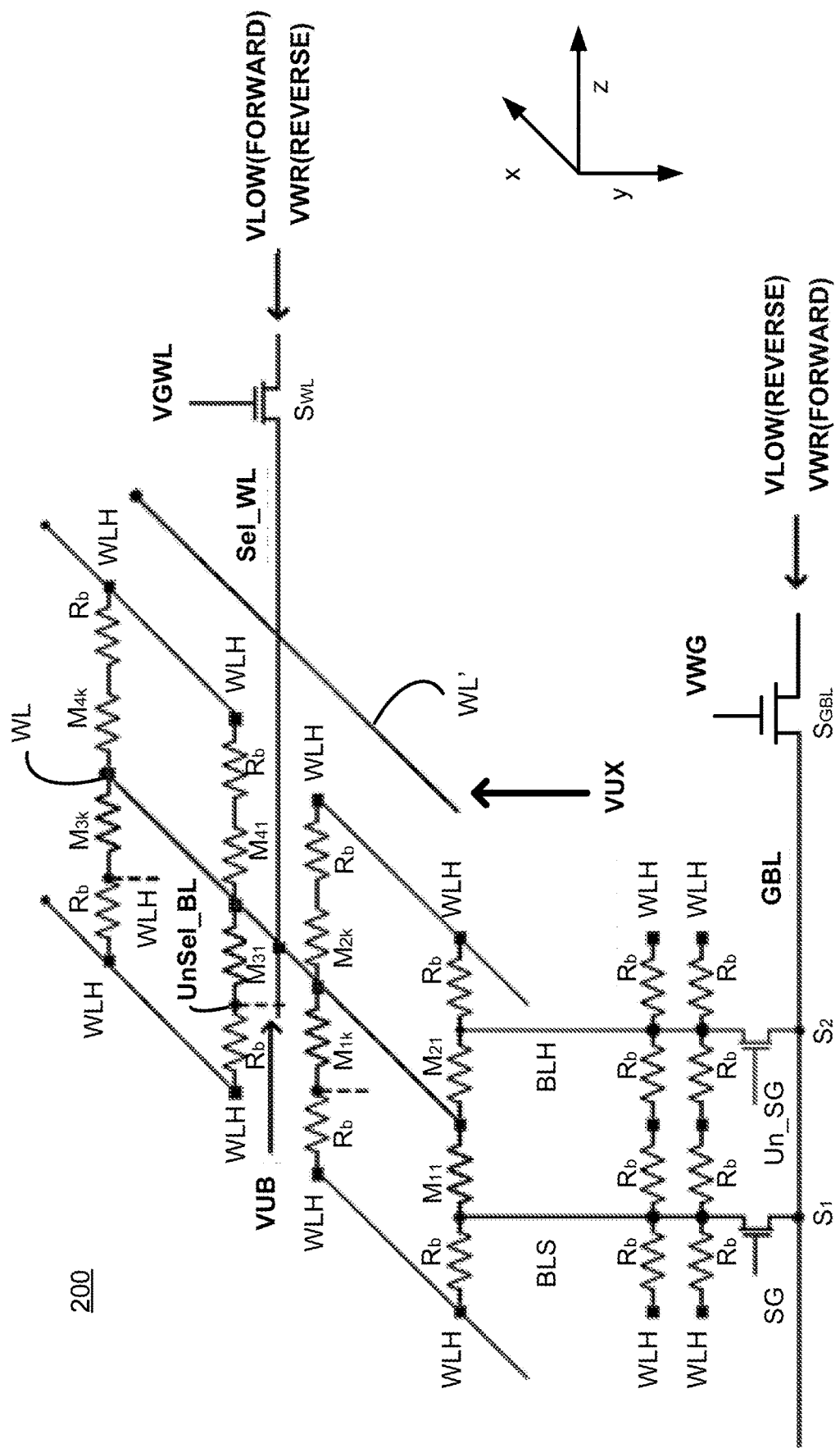
FIG. 2 is a circuit diagram of example memory cells according to an example embodiment.

Referring to FIG. 2, illustrated is a circuit diagram of example memory cells 200, according to an example embodiment. The memory cells 200 may be memory cells in a portion of the bay 160 of FIG. 1. The memory cells 200 may be memory cells of a resistive memory device. The memory cells 200 include a plurality of memory cells $M_{11} \ldots M_{1k}$, $M_{21} \ldots M_{2k}$, and $M_{31} \ldots M_{3k}$, and $M_{41} \ldots M_{4k}$. A resistance value of each memory cell M can be adjusted to store input data. For example, a low resistance of a memory cell M below a threshold resistance may represent a value '0' and a high resistance of the memory cell M above the threshold resistance may represent a value '1.'

In some embodiments, the memory cells M have first ends coupled to a word line WL extending along a x-direction and second ends coupled to corresponding bit lines BLS or BLH extending along a y-direction. Each of the bit lines may be coupled to a plurality of feed resistors $R_b$, through which a voltage can be applied. Each second end of the bit line may be coupled to a switch S. The switch S is an electrical circuit that selectively couples a bit line extending along a y-direction to a global bit line GBL extending along a z-direction. The switch S may be embodied as a transistor (e.g., thin film transistor). For example, in response to a voltage SG (e.g., a voltage corresponding to logic '1') applied to a gate terminal of the switch S, the switch S electrically couples the bit line to the global bit line GBL, and in response to a voltage Un_SG (e.g., a voltage corresponding to logic '0') applied to a gate terminal of the switch S, the switch S electrically decouples the bit line from the global bit line GBL. The voltages SG and Un_SG are control signals for controlling the switches S. The voltages SG and Un_SG may be generated by a driving circuit (e.g., stripe controller 170 or bay controller 175). Unselected bit lines UnSel-BL may be applied with a voltage VUB. The voltage VUB is a voltage applied to an unselected bit line. The voltage VUB may be generated by a driving circuit (e.g., stripe controller 170 or bay controller 175).

Although not shown for simplicity, additional memory cells, bit lines, feed resistors and switches S may be added between another word line WL' extending along the x-direction and the global bit line GBL extending along the z-direction. For example, feed resistor $R_b$, additional memory cells, and another feed resistor $R_b$ may be coupled to the feed resistor $R_b$, memory cells $M_{11}$, $M_{21}$, and another feed resistor $R_b$ in series, with the word line WL' coupled between the additional memory cells. In some embodiments, additional bit lines, feed resistors $R_b$ and switches S may be coupled to corresponding ends of the additional memory cells and the global bit line GBL, in a similar manner as the bit lines, the feed resistors $R_b$ and switches S coupled to corresponding ends of the memory cells $M_{11}$, $M_{21}$ and the global bit line GBL.

In some embodiments, the word line WL is coupled to a switch $S_{WL}$, through which a voltage can be provided. Different word line WL' may be coupled to another switch (not shown). The switch $S_{WL}$ is an electrical circuit that selectively couples the word line WL to a driving circuit (e.g., stripe controller 170 or bay controller 175). The switch $S_{WL}$ may be embodied as a transistor (e.g., thin film transistor). For example, in response to a signal VGWL having a voltage corresponding to logic '1' applied to a gate terminal of the switch $S_{WL}$, the switch $S_{WL}$ electrically couples the word line WL to the driving circuit, and in response to the signal VGWL having different voltage corresponding to logic '0' applied to the gate terminal of the switch $S_{WL}$, the switch $S_{WL}$ electrically decouples the word line WL from the driving circuit. The signal VGWL is a control signal for controlling the switch $S_{WL}$. The signal VGWL may be generated by a driving circuit (e.g., stripe controller 170 or bay controller 175). When the word line WL is selected (i.e., or is coupled to the driving circuit), a signal VLOW or VWR may be supplied to the word line WL. The signals VLOW and VWR are signals applied to memory cells M for changing resistance values. The signals VLOW and VWR may be generated by a driving circuit (e.g., stripe controller 170 or bay controller 175). During a set operation to change a high resistance value of a memory cell to a low resistance value, the signal VWR may be applied to the selected word line WL, and the signal VLOW may be applied to the global bit line GBL. During a reset operation to change the low resistance value of the memory cell to the high resistance value, the signal VLOW may be applied to the selected word line WL, and the signal VWR may be applied to the global bit line GBL. When the word line WL is not selected (i.e., not coupled to the driving circuit), a voltage VUX may be supplied to the word line WL. The voltage VUX is a voltage applied to an unselected word line. The voltage VUX may be generated by a driving circuit (e.g., stripe controller 170 or bay controller 175).

In some embodiments, the global bit line GBL is coupled to a switch $S_{GBL}$, through which a voltage can be provided. The switch $S_{GBL}$ is an electrical circuit that selectively couples the global bit line GBL to a driving circuit (e.g., stripe controller 170 or bay controller 175). The switch $S_{GBL}$ may be embodied as a transistor (e.g., thin film transistor). For example, in response to a signal VWG having a voltage corresponding to logic '1' applied to a gate terminal of the switch $S_{GBL}$, the switch $S_{GBL}$ electrically couples the global bit line GBL to the driving circuit, and in response to the signal VWG having a voltage corresponding to logic '0' applied to the gate terminal of the switch $S_{GBL}$, the switch $S_{GBL}$ electrically decouples the global bit line GBL from the driving circuit. The signal VWG is a control signal for controlling the switch $S_{GBL}$. The signal VWG may be generated by a driving circuit (e.g., stripe controller 170 or bay controller 175). When the global bit line GBL is coupled to the driving circuit, a voltage VWR or VLOW may be supplied to the global bit line GBL. When the global bit line GBL is not coupled to the driving circuit, the global bit line GBL may be floated.

Figure 3:
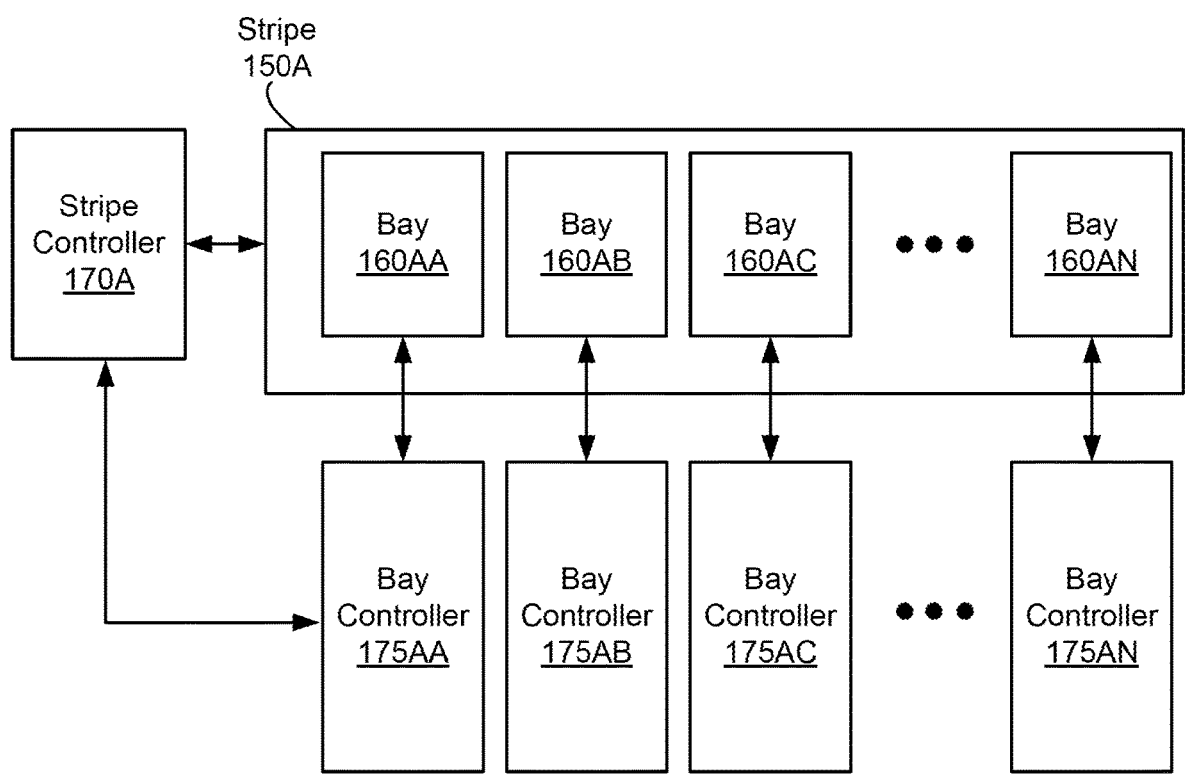
FIG. 3 is a block diagram of controllers controlling bays in a stripe according to an example embodiment.

Referring to FIG. 3, illustrated is a block diagram depicting a stripe controller 170A and bay controllers 175AA, 175AB . . . 175AN, which control bays 160AA, 160AB . . . 160AN in a stripe 150A, according to an example embodiment. Each of the bay controllers 175 is coupled to a corresponding bay 160 through a respective conductive connection. The stripe controller 170A is coupled to each of the bays 160AA-160AN through a common conductive connection, and is coupled to each of the bay controllers 175AA-175AN through another common conductive connection. In this configuration, these components operate together to supply various voltages (e.g., VLOW, VWR, VGWL, VUB, VUX, VWG of FIG. 2) or currents to memory cells in bays. In one aspect, each bay controller 175 can selectively supply a voltage or current to memory cells in a corresponding bay 160 for writing or reading data. The stripe controller 170A may control operations of the bay controllers 175 or directly provide a voltage or current to the bays 160.

Figure 4:
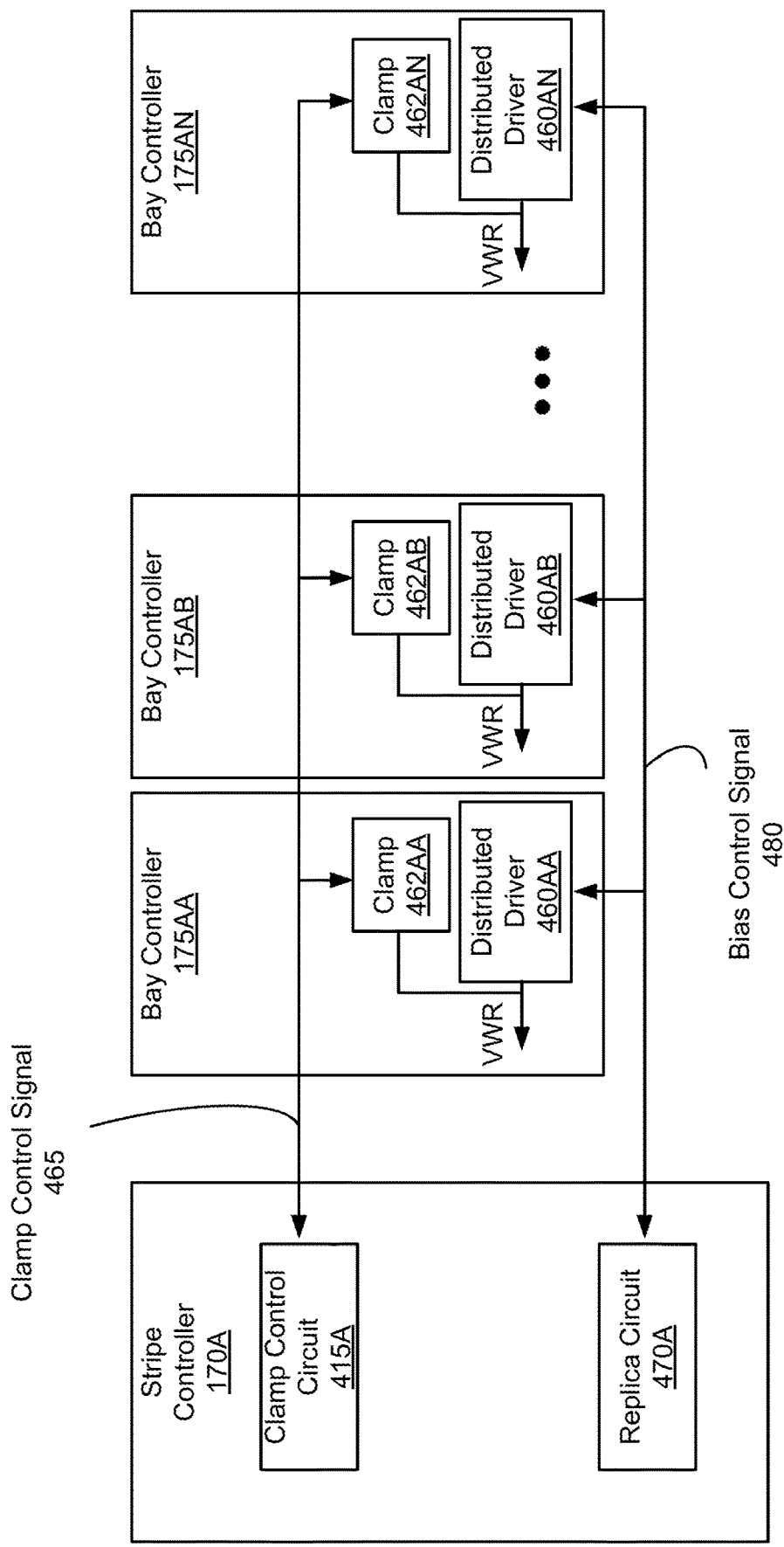
FIG. 4 is a block diagram of a stripe controller and bay controllers according to an example embodiment.

Referring to FIG. 4, illustrated is a block diagram of a stripe controller 170A and bay controllers 175AA-175AN for generating voltages (e.g., VWR) for selected word lines or selected bit lines according to an example embodiment. In some embodiments, the stripe controller 170A is coupled to the bay controllers 175AA-175AN through conductive lines for providing a bias control signal 480 and a clamp control signal 465. A bias control signal 480 is a signal indicative of a target voltage or a target current to be provided to memory cells. A clamp control signal 465 is a signal for providing additional source current or additional sink current to memory cells. The bay controller 175 receives the bias control signal 480 and provides voltages (e.g., VWR) to corresponding memory cells, according to the bias control signal 480. The bay controller 175 may receive the clamp control signal 465 and optionally source or sink current to corresponding memory cells to improve settling time of the voltages (e.g., VWR) output by the bay controller 175.

In some embodiments, the bay controller 175 includes a distributed driver 460 and a clamp circuit 462. The distributed driver 460 is a circuit having an output coupled to corresponding memory cells in a bay to supply a voltage (e.g., VWR, etc.) to the corresponding memory cells. The distributed driver 460 may receive the bias control signal 480, and generate the voltage according to the bias control signal 480. The clamp circuit 462 is a circuit that is coupled to the corresponding distributed driver 460 and optionally sink or source current to the memory cells for improving settling time of the voltage (e.g., VWR) at the memory cells. The clamp circuit 462 may receive the clamp control signal 465, and compare the voltage (e.g., VWR) at the memory cells with the clamp control signal 465. If a difference between the voltage (e.g., VWR) at the memory cells and the voltage of the clamp control signal 465 is larger than a predetermined threshold, the clamp circuit 462 may sink or source current to memory cells to improve settling of the voltage (e.g., VWR) at the memory cells. If the difference between the voltage (e.g., VWR) at the memory cells and the voltage of the clamp control signal 465 is less than the predetermined threshold, the clamp circuit 462 may not sink or source current to the memory cells.

In some embodiments, the stripe controller 170A includes a clamp control circuit 415A and a replica circuit 470A. A replica circuit 470A is a circuit that regulates the bias control signal 480. The replica circuit 470A may replicate the distributed driver 460 or a portion of the distributed driver 460 to regulate the bias control signal 480. By employing the replica circuit 470A, the bias control signal 480 can be provided to the distributed drivers 460 with reduced effects from the changes in the voltage (e.g., VWR) or current at the memory cells in different bays. A clamp control circuit 415A is a circuit that generates the clamp control signal 465. Generating the clamp control signal 465 by the clamp control circuit 415 enables the clamp circuits 462 to optionally sink or source current to memory cells in different bays. Accordingly, the stripe controller 170A and the bay controller 175 can provide varying levels of voltage or current to memory cells with improved accuracy and speed. Detailed implementations and operations of the clamp control circuit 415A, replica circuit 470A, distributed driver 460, and clamp circuit 462 are described below with respect to FIGS. 6 through 10.

Figure 5:
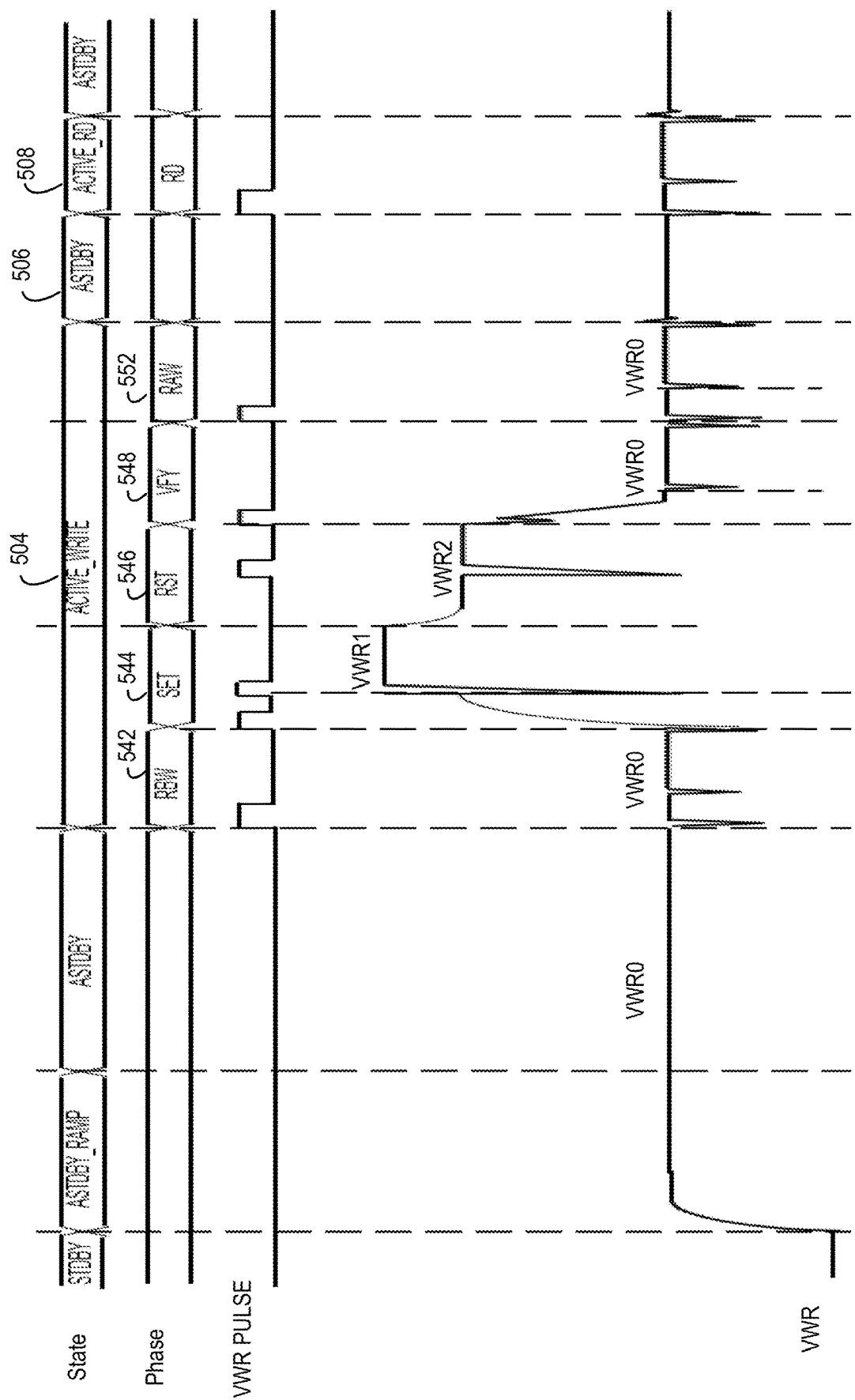
FIG. 5 is an example timing diagram of voltages applied to memory cells according to an example embodiment.

Referring to FIG. 5, illustrated is an example timing diagram of voltages applied to memory cells according to an example embodiment. In one embodiment, the memory device 115 performs a write operation 504 and a read operation 508 at different time periods. The memory device 115 may be in standby 506 between the write operation 504 and the read operation 508. In some embodiments, the distributed drivers 460 output a relatively constant voltage (e.g., VWR0) during the standby 506 and the read operation 508 periods.

In some embodiments, the write operation 504 is performed through different phases: read before write RBW 542, SET 544, reset RST 546, verify VFY 548, and read after write RAW 552. Phases may be changed in response to a VWR pulse. During different phases, the distributed drivers 460 may output voltages VWR at varying voltage levels (e.g., VWR0, VWR1, VWR2) to selected memory cells. In one aspect, improving an operation speed of a memory device 115 involves reducing settling time allocated for voltages changing in different phases to settle. Current loads, capacitive loads, or a combination of them may change during different phases, and configuring different voltages to settle within a short settling time (e.g., 100 ns) in different phases may be challenging. By employing the distributed driver 460 and the stripe controller 170 with the replica circuit 470, the voltages VWR with different voltage levels may be provided to memory cells with a short settling time (e.g., 100 ns).

Figure 6:
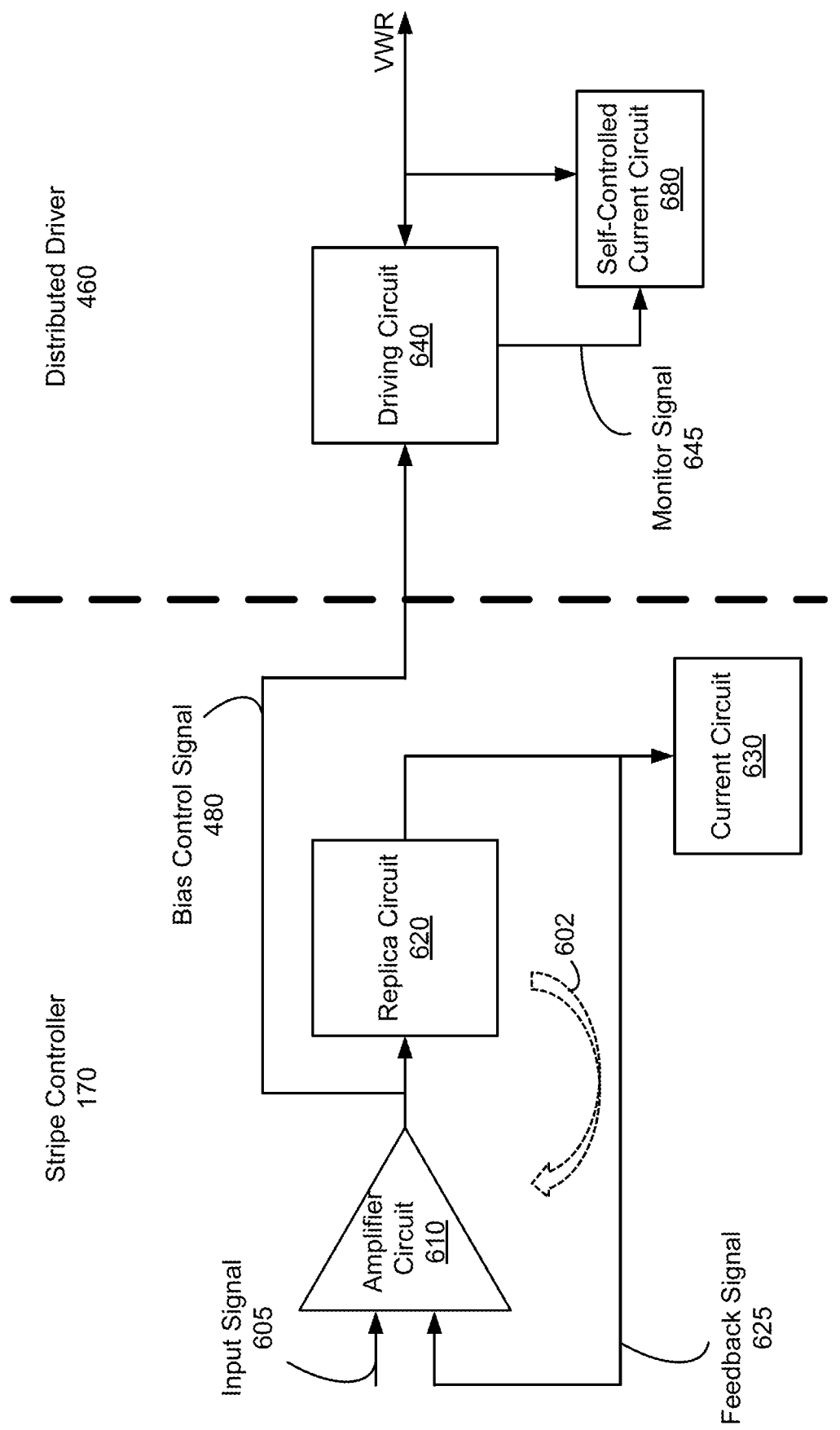
FIG. 6 is a detailed block diagram of a stripe controller and a distributed driver according to an example embodiment.

Referring to FIG. 6, illustrated is a detailed block diagram of a stripe controller 170 and a distributed driver 460 according to an example embodiment. In one embodiment, the stripe controller 170 includes an amplifier circuit 610, a replica circuit 620, and a current circuit 630. The distributed driver 460 includes a driving circuit 640 and a self-controlled current circuit 680. These components operate together to receive an input signal 605 indicating a target voltage or current to be provided to memory cells, and provide the voltage (e.g., VWR) or the current to the memory cells according to the input signal 605.

In one aspect, the driving circuit 640 receives the bias control signal 480 and generates a voltage (e.g., VWR) that is applied to memory cells to drive those memory cells. The driving circuit 640 may also generate a monitor signal 645 for configuring the self-controlled current circuit 680 based on the bias control signal 480. The monitor signal 645 is a signal indicative of a voltage of the bias control signal 480 for configuring the self-controlled current circuit 680. For example, an increase in the bias control signal 480 causes a decrease in the monitor signal 645, and a decrease in the bias control signal 480 causes an increase in the monitor signal 645. The driving circuit 640 includes an input terminal coupled to the stripe controller 170 to receive the bias control signal 480, an output terminal coupled to memory cells to provide a voltage (e.g., VWR), and a monitoring terminal coupled to the self-controlled current circuit 680 to output the monitor signal 645. In one approach, the driving circuit 640 employs a local feedback loop (e.g., local feedback loop 704 from FIG. 7) to receive the bias control signal 480 and generate the monitor signal 645 and the output voltage (e.g., VWR) through the local feedback loop. The local feedback loop is a feedback loop in the distributed driver 460 that receives a bias control signal 480 and sources or sinks current to regulate the voltage (e.g., VWR) provided to the memory cells. Hence, the local feedback loop is local to a specific, corresponding distributed driver 460. Detailed implementation and operation of the driving circuit 640 are described below with respect to FIG. 7.

The self-controlled current circuit 680 is a circuit that sinks (or sources) current at the output of the driving circuit 640 according to the monitor signal 645 from the driving circuit 640 until the voltage at the output of the driving circuit 640 reaches a predetermined voltage. The self-controlled current circuit 680 includes the input terminal coupled to the monitoring terminal of the driving circuit 640 to receive the monitor signal 645, and an output terminal coupled to the output terminal of the driving circuit 640. In this configuration, the self-controlled current circuit 680 may sink or source current at the output terminal of the driving circuit 640 to improve settling speed of the voltage at the output terminal of the driving circuit 640.

In one aspect, the amplifier circuit 610, the replica circuit 620, and the current circuit 630 form a common feedback loop 602 to generate the bias control signal 480 according to an input signal 605. The input signal 605 is a signal indicative of a target voltage or a target current to be provided to memory cells. The input signal 605 may be generated by a driving circuit (e.g., stripe controller 170). The common feedback loop 602 is a feedback loop in the stripe controller 170 that receives the input signal 605 and regulates the bias control signal 480 provided to the distributed drivers 460 to stabilize voltage (e.g., VWR) provided to memory cells. Hence, the distributed drivers 460 are commonly controlled by the common feedback loop 602, which is a feedback loop within the common strip controller 170. Stabilizing a voltage may include reducing a fluctuation in a high frequency component of the voltage. The amplifier circuit 610 is a circuit that compares the input signal 605 and a feedback signal 625 from the replica circuit 620 and generates the bias control signal 480 according to the comparison. The feedback signal 625 is a signal predicting a voltage (e.g., VWR) output by the driving circuit 640. The feedback signal 625 may be generated by the replica circuit 620. The amplifier circuit 610 includes input terminals to receive the input signal 605 and the feedback signal 625, and includes an output terminal to output the bias control signal 480. The replica circuit 620 is a circuit that receives the bias control signal 480 and replicates the driving circuit 640 or a portion of the driving circuit 640 to generate the feedback signal 625. The replica circuit 620 includes an input terminal coupled to both the output terminal of the amplifier circuit 610 and an input terminal of the driving circuit 640. The replica circuit 620 also includes an output terminal coupled to an input terminal of the amplifier circuit and the current circuit 630. The current circuit 630 is a circuit that provides a DC current path to the replica circuit 620. In this configuration, the common feedback loop 602 can generate the bias control signal 480 with a steady voltage despite a large variation in the voltage or current at the output of the driving circuit 640.

Figure 7:
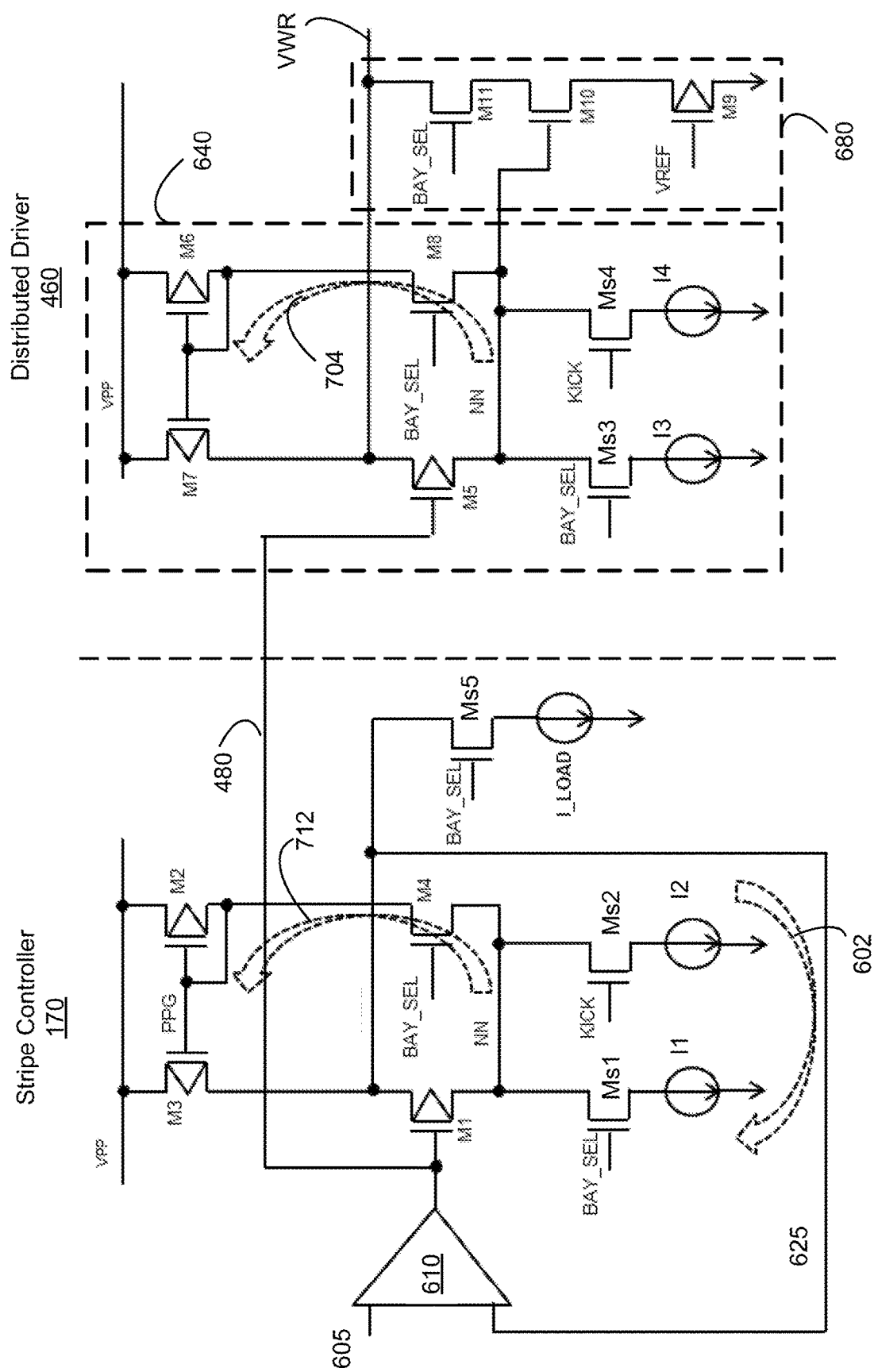
FIG. 7 is an example circuit diagram of the stripe controller and the distributed driver of FIG. 6 according to an example embodiment.

Referring to FIG. 7, illustrated is an example circuit diagram of the stripe controller 170 and the distributed driver 460 of FIG. 6 according to an example embodiment. In some embodiments, the stripe controller 170 includes the amplifier circuit 610, transistors M1-M4, Ms1, Ms2, Ms5 and current sources I1, I2, I_Load, and the distributed driver 460 includes transistors M5-M11, Ms3, Ms4, and current sources I3, I4. The transistors M4, M8, M10, M11, and Ms1-Ms5 may be N-type transistors, and the transistors M1-M3, M5-M7 and M9 may be P-type transistors. P-type transistor may be a PNP transistor or a P-channel MOSFET, where N-type transistor may be an NPN transistor or an N-channel MOSFET. These components operate together to receive the input signal 605 and generate the voltage (e.g., VWR) to operate the memory cells. In other embodiments, some of P-type transistors shown in FIG. 7 may be implemented by N-type transistors, and some of N-type transistors shown in FIG. 7 may be implemented by P-type transistors.

In one configuration, the transistors M5-M8 form a part of the driving circuit 640 of FIG. 6. The transistor M5 includes a gate terminal, which is the input terminal or coupled to the input terminal of the driving circuit 640 to receive the bias control signal 480 from the stripe controller 170. The transistor M5 also includes a drain terminal coupled to a node NN, which is the monitoring terminal of the driving circuit 640. The transistor M5 includes a source terminal, which is the output terminal or is coupled to the output terminal of the driving circuit 640. The transistor M8 includes a source terminal coupled to the node NN, a drain terminal coupled to the drain terminal of the transistor M6, and a gate terminal coupled to a conductive line for receiving a signal BAY_SEL. The signal BAY_SEL is a signal that enables or disables the driving circuit 640. The signal BAY_SEL may be generated by a driving circuit (e.g., stripe controller 170 or a distributed driver 460). For example, the signal BAY_SEL having a voltage corresponding to logic '1' causes the transistor M8 to conduct current, where the signal BAY_SEL having a voltage corresponding to logic '0' causes the transistor M8 to not conduct current. Thus, the transistor M8 operates as a switch (or a switch transistor) that electrically couples the node NN to the drain terminal of the transistor M6 to enable a current flow through the transistor M6 or decouple the node NN from the drain terminal of the transistor M6 to disable a current flow through the transistor M6, according to the signal BAY_SEL. The transistor M6 is a diode connected transistor having a source terminal coupled to a first voltage rail for receiving a first supply voltage (e.g., VPP), a drain terminal coupled to the drain terminal of the transistor M8 and the gate terminal of the transistor M6. The transistor M7 is a mirroring transistor having a source terminal coupled to the first voltage rail, a drain terminal coupled to the source terminal of the transistor M5 and a gate terminal coupled to the gate terminal of the transistor M6.

In this configuration, the driving circuit 640 generates the voltage VWR according to the bias control signal 480 through a local feedback loop 704. For example, the transistor M5 operates as an input transistor to receive the bias control signal 480 and to change the voltage (e.g., VWR) at the output of the driving circuit 640. In one approach, in response to an increase in the bias control signal 480, the transistor M5 conducts less current thus causing a voltage at the node NN to decrease. The decrease in the voltage at the node NN causes an increased current flow through the transistor M8. The transistors M6 and M7 operate as a current mirror circuit that mirrors a current flow through the transistor M8 to change the voltage VWR at the output terminal of the driving circuit 640. Specifically, an increased current through the transistor M6 causes an increased current through the transistor M7. The increased current through the transistor M7 causes the voltage VWR at the output terminal of the driving circuit 640 to increase. The increase in the voltage VWR at the output terminal then may cause the voltage at the node NN to increase, rendering the voltage VWR to settle according to the bias control signal 480. The driving circuit 640 operates in a similar principle with respect to a decrease in the bias control signal 480.

In one configuration, the transistors Ms3, Ms4 and the current sources I3, I4 form another part of the driving circuit 640 of FIG. 6 to supply DC current to the transistors M5-M8. The transistor Ms3 and the current source I3 are coupled between the node NN and a second voltage rail for receiving a second supply voltage (e.g., GND) in series, where the second supply voltage may be lower than the first supply voltage (e.g., VPP). A gate terminal of the transistor Ms3 is coupled to the conductive line for receiving the signal BAY_SEL. The transistor Ms4 and the current source I4 are coupled between the node NN and the second voltage rail in series. A gate terminal of the transistor Ms4 is coupled to the conductive line for receiving the signal KICK.

In this configuration, the signal BAY_SEL having a voltage corresponding to logic '1' causes the transistor Ms3 to couple the current source I3 to the node NN to allow current from the current source I3 to flow through the transistors M5-M8, where the signal BAY_SEL having a voltage corresponding to logic '0' causes the transistor Ms3 to decouple the current source I3 from the node NN to disable current from the current source I3 to flow through the transistors M5-M8. Similarly, the signal KICK having a voltage corresponding to logic '1' causes the transistor Ms4 to couple the current source I4 to the node NN to allow current from the current source I4 to flow through the transistors M5-M8, where the signal KICK having a voltage corresponding to logic '0' causes the transistor Ms4 to decouple the current source I4 from the node NN to disable current from the current source I4 to flow through the transistors M5-M8.

In one configuration, the transistors M9-M11 form the self-controlled current circuit 680 of FIG. 6. The transistor M9 includes a drain terminal coupled to the second voltage rail, a source terminal coupled to a source terminal of the transistor M10, and a gate terminal coupled to a conductive line to receive a reference voltage VREF. The reference voltage VREF is a signal indicative of a target voltage level at the node NN or the output of the driving circuit 640 to enable or disable the self-controlled current circuit 680. The reference voltage VREF may be generated by the distributed driver 460 or the stripe controller 170. The transistor M10 includes a gate terminal coupled to the node NN of the driving circuit 640, a source terminal coupled to the source terminal of the transistor M9, and a drain terminal coupled to a source terminal of the transistor M11. The transistor M11 includes a gate terminal coupled to the conductive line to receive the signal BAY_SEL, a source terminal coupled to the drain terminal of the transistor M10, and a drain terminal coupled to the source terminal of the transistor M5 and a drain terminal of the transistor M7.

In this configuration, the transistor M9 operates as a variable current source, where the transistors M10, M11 operate as control switches. The signal BAY_SEL having a voltage corresponding to logic '1' causes the transistor M11 to turn on to couple the drain terminal of the transistor M10 to the output terminal of the driving circuit 640 to allow current from the transistor M9 to flow through the transistors M10, M11, where the signal BAY_SEL having a voltage corresponding to logic '0' causes the transistor M11 to turn off to decouple the drain terminal of the transistor M10 from the output terminal of the driving circuit 640 to disable current from the transistor M9 to flow through the transistors M10, M11. When the voltage at the node NN increases such that a voltage difference between the gate terminal of the transistor M10 and the source terminal of the transistor M10 becomes larger than a threshold voltage of the transistor M10, the transistor M10 is turned on to electrically couple the source node of the transistor M9 to the source node of the transistor M11. If the voltage difference between the gate terminal of the transistor M10 and the source terminal of the transistor M10 is less than the threshold voltage of the transistor M10, the transistor M10 is turned off to electrically decouple the source node of the transistor M9 from the source node of the transistor M11. When the transistors M10, M11 are turned on, the transistor M9 may sink current from the output terminal of the driving circuit 640 to decrease the voltage VWR until the voltage difference between the voltage VREF and the voltage VWR becomes less than the threshold voltage of the transistor M9. The transistor M9 does not conduct current, if the voltage difference between the voltage VREF and the voltage VWR becomes less than the threshold voltage of the transistor M9. The decrease in the voltage M9 may further cause the voltage at the node NN to decrease to turn off the transistor M10. Accordingly, the self-controlled current circuit 680 may automatically sink a large amount current at the output terminal of the driving circuit 640 until the voltage VWR reaches a predetermined voltage (e.g., a sum of the voltage VREF and a threshold voltage of the transistor M9).

In one configuration, the transistors M1-M4, Ms1, Ms2, and the current sources I1, I2 form the replica circuit 620 of FIG. 6. The transistors M1-M4, Ms1, Ms1, and the current sources I1, I2 correspond to M5-M8, Ms3, Ms4, and the current sources I3, I4 of the driving circuit 640, respectively. Hence, the replica circuit 620 includes the similar structure of the driving circuit 640, except the gate terminal of the transistor M1 is coupled to the output terminal of the amplifier circuit 610 and the gate terminal of the transistor M5, and the source terminal of the transistor M1 is coupled to an input terminal of the amplifier circuit 610. In this configuration, the replica circuit 620 operates with a feedback loop 712 formed by the transistors M1-M4 in a similar manner as the driving circuit 640 with the local feedback loop 704 formed by the transistors M5-M8, where the transistor M1 operates as an input transistor to receive the bias control signal 480 and generate the feedback signal 625 according to the bias control signal 480.

In one aspect, the common feedback loop 602 is formed by the amplifier circuit 610 and the replica circuit 620 to improve regulation of the bias control signal 480. Assuming for an example that any change in the voltage VWR induces perturbation on the bias control signal 480, for example, due to capacitive coupling. Such change in the bias control signal 480 causes change in voltage of the feedback signal 625 through the feedback loop 712, as described above with respect to the feedback loop 704 above. By feeding the feedback signal 625 to the amplifier circuit 610, the amplifier circuit 610 can compare the input signal 605 and the feedback signal 625, and adjust the bias control signal 480 to reduce the difference between the input signal 605 and the feedback signal 625 through the common feedback loop 602. Accordingly, the bias control signal 480 can be stabilized and be less susceptible to any changes in the voltage (e.g., VWR) at the output terminal of the distributed driver 460, for example, due to fast current sinking by the self-controlled current circuit 680 or other perturbation at the memory cells.

In one configuration, the transistors Ms5 and the current source I_LOAD form the current circuit 630 of FIG. 6. In one configuration, the transistor Ms5 and the current source I_LOAD are coupled between the source terminal of the transistor M1 (or the output terminal of the replica circuit 470) and the second voltage rail in series. A gate terminal of the transistor Ms5 is coupled to the conductive line for receiving the signal BAY_SEL. The signal BAY_SEL having a voltage corresponding to logic '1' causes the transistor Ms5 to turn on to allow current from the current source I_LOAD to flow through the transistor Ms5, where the signal BAY_SEL having a voltage corresponding to logic '0' causes the transistor Ms5 to turn off to disable current from the current source I_LOAD to flow through the transistor Ms5. Unlike the distributed driver 460, the node NN of the replica circuit 620 is not tapped by the transistor Ms5 or the current source I_LOAD.

In one aspect, the transistor M5 is a means for receiving a control signal (e.g., bias control signal 480). The transistor M10 is a means for coupling the transistor M9 to a source terminal of the transistor M5, in response to a voltage at a drain terminal of the transistor M5 is over a first predetermined voltage (e.g., a sum of the reference voltage VREF and a threshold voltage of the transistor M9 and a threshold voltage of the transistor M10). The transistor M9 is a means for sinking current at the source of the transistor M5 until a voltage at the source of the transistor M5 is below a second predetermined voltage (e.g., a sum of the reference voltage VREF and a threshold voltage of the transistor M9).

Figure 8:
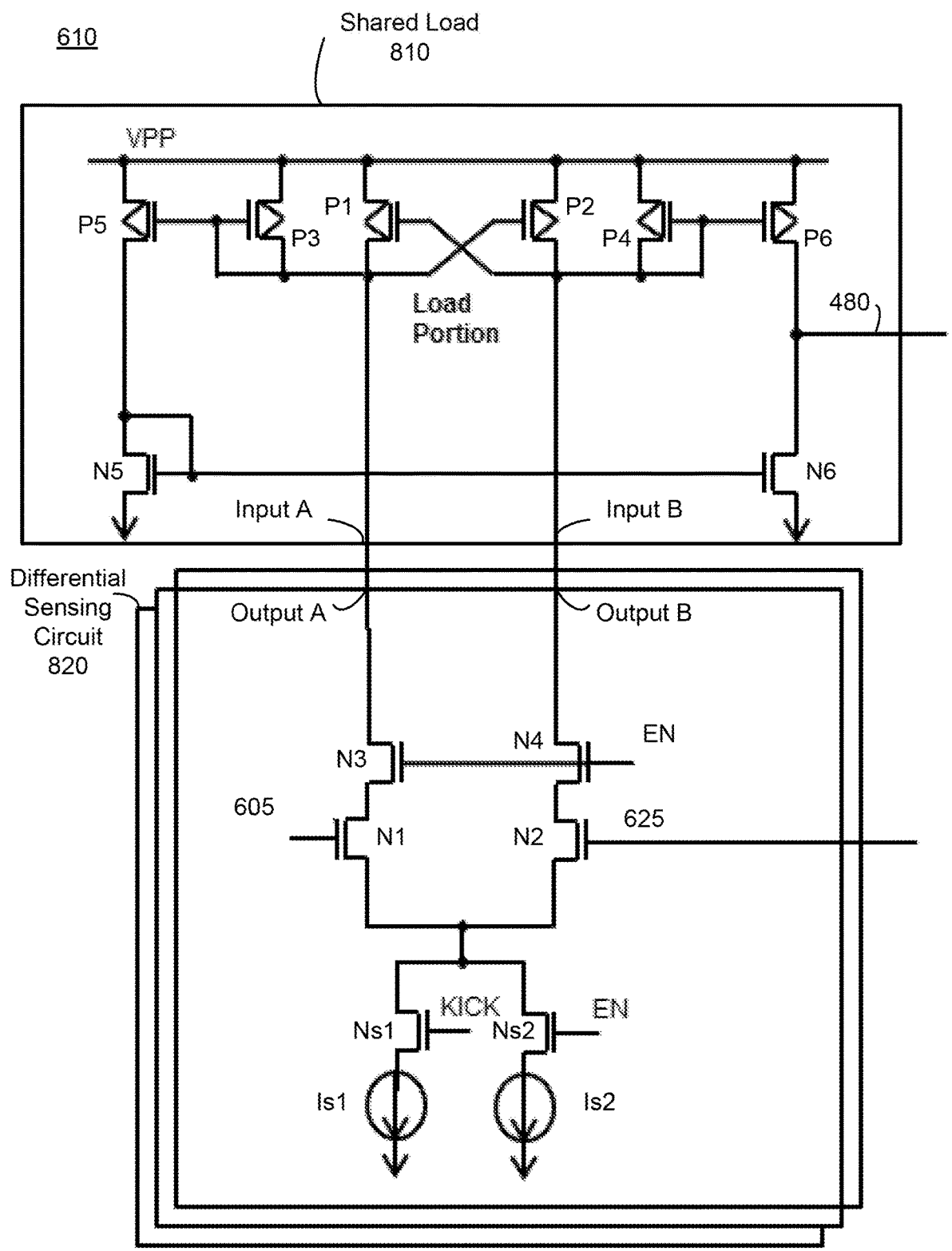
FIG. 8 is an example circuit diagram of the amplifier circuit of FIG. 6 according to an example embodiment.

Referring to FIG. 8, illustrated is an example circuit diagram of the amplifier circuit 610 of FIG. 6 according to an example embodiment. In some embodiments, the amplifier circuit 610 includes a shared load 810 and a plurality of differential sensing circuits 820. In one aspect, the plurality of differential sensing circuits 820 are coupled to each other in parallel, and each of the plurality of differential sensing circuits 820 is coupled to the shared load 810 in series. Specifically, the plurality of differential sensing circuits 820 have outputs A coupled to input A of the shared load 810 and outputs B coupled to input B of the shared load 810. The shared load 810 is a circuit that receives current from one or more of the differential sensing circuits 820, and generates the bias control signal 480 according to the receive current. The current received by the shared load 810 may be source current or sink current. A differential sensing circuit 820 is a circuit that receives the input signal 605 and the feedback signal 625, and provides current to the shared load 810, according to a difference between the input signal 605 and the feedback signal 625. One or more of the plurality of differential sensing circuits 820 may be optionally enabled to change an amount of current supplied to the input A, input B of the shared load 810, thereby allowing a speed of the amplifier circuit 610 to be adjusted. In other embodiments, the amplifier circuit 610 includes more, fewer, or different components than shown in FIG. 8.

In some embodiments, the differential sensing circuit 820 includes transistors N1-N4, Ns1, Ns2, and current sources Is1, Is2. The transistors N1-N4, Ns1, Ns2 may be N-type transistors. These components operate together to receive the input signal 605 and the feedback signal 625, and supply current through the output A, output B according to a difference between the input signal 605 and the feedback signal 625. In other embodiments, some of N-type transistors of the differential sensing circuit 820 may be implemented by P-type transistors.

In one configuration, the transistors N1, N2 form a differential pair to receive the input signal 605 and the feedback signal 625. The transistor N1 has a gate terminal coupled to a conductive line for receiving the input signal 605, a source terminal coupled to a source terminal of the transistor N2, and a drain terminal coupled to a source terminal of the transistor N3. The transistor N2 has a gate terminal coupled to a conductive line for receiving the feedback signal 625 and a drain terminal coupled to a source terminal of the transistor N4. In this configuration, when the differential pair formed by the transistors N1, N2 is enabled, the differential pair steers current to the shared load 810 according to a difference between voltages of the input signal 605 and the feedback signal 625. For example, if a voltage of the input signal 605 is higher than a voltage of the feedback signal 625, more current flows through the drain terminal of the transistor N1 than the drain terminal of the transistor N2.

In one configuration, the transistors N3, N4 operate as switches to enable or disable the differential pair formed by the transistors N1, N2. The transistor N3 has the source terminal coupled to the drain terminal of the transistor N1, a drain terminal coupled to the output A, and a gate terminal coupled to a conductive line for receiving an enable signal EN. Similarly, the transistor N4 has the source terminal coupled to the drain terminal of the transistor N2, a drain terminal coupled to the output B, and a gate terminal coupled to the conductive line for receiving the enable signal EN. The enable signal EN is a signal for enabling or disabling the differential pair formed by the transistors N1, N2. For example, in response to the enable signal EN having a voltage corresponding to logic '1' applied to gate terminals of the transistors N3, N4, the transistors N3, N4 electrically couple the drain terminals of the transistors N1, N2 to output A, output B, respectively, and in response to the signal EN having a voltage corresponding to logic '0' applied to the gate terminals of the transistors N3, N4, the transistors N3, N4 electrically decouple the drain terminals of the transistors N1, N2 from the output A, output B, respectively. The enable signal EN may be generated by a driving circuit (e.g., stripe controller 170).

In one configuration, the transistors Ns1, Ns2 and the current sources Is1, Is2 selectively supply DC current to the transistors N1-N4. The transistor Ns1 and the current source Is1 are coupled between source terminals of the transistors N1, N2 and the second voltage rail for receiving the second supply voltage (e.g., GND) in series. A gate terminal of the transistor Ns2 is coupled to the conductive line for receiving the signal KICK. The transistor Ns2 and the current source Is2 are coupled between the source terminals of the transistors N1, N2 and the second voltage rail in series. A gate terminal of the transistor Ns2 is coupled to the conductive line for receiving the enable signal EN.

In this configuration, the enable signal EN having a voltage corresponding to logic '1' causes the transistor Ns2 to allow current from the current source Is2 to be provided to the differential pair formed by the transistors N1, N2, where the enable signal EN having a voltage corresponding to logic '0' causes the transistor Ns2 to disallow current from the current source Is2 to be provided to the differential pair formed by the transistors N1, N2. Similarly, the signal KICK having a voltage corresponding to logic '1' causes the transistor to allow current from the current source Is1 to be provided to the differential pair formed by the transistors N1, N2, where the signal KICK having a voltage corresponding to logic '0' causes the transistor Ns1 to disallow current from the current source Is1 to be provided to the differential pair formed by the transistors N1, N2.

In some embodiments, the shared load 810 includes transistors P1-P6 and N5, N6. These components operate together to receive current from the differential sensing circuit 820, and generate the bias control signal 480 according to the received current. In other embodiments, some of N-type transistors of the shared load 810 may be implemented by P-type transistors, and some of P-type transistors of the shared load 810 may be implemented by N-type transistors.

In one configuration, the transistors P1, P2 are cross-coupled with each other to form a positive feedback, such that a gate terminal of the transistor P2 is coupled to the drain terminal of the transistor P1 and the input A, and a gate terminal of the transistor P1 is coupled to the drain terminal of the transistor P2 and the input B. Source terminals of the transistors P1, P2 are coupled to the first voltage rail for receiving a supply voltage VDD.

In one implementation, the transistors P3-P6 and N5, N6 operate together to receive current from the transistors N1, N2 and generate the bias control signal 480 according to the received current. The transistor P3 includes a drain terminal coupled to the drain terminal of the transistor P1, a gate terminal coupled to the drain terminal of the transistor P1, and a source terminal coupled to the first voltage rail. The transistor P5 includes a gate terminal coupled to the drain terminal of the transistor P1, a drain terminal coupled to a source terminal of the transistor N5, and a source terminal coupled to the first voltage rail. The transistor N5 includes a source terminal coupled to the second voltage rail. The transistor N5 also includes a gate terminal coupled to the drain terminal of the transistor N5, the drain terminal of the transistor P5, and the gate terminal of the transistor N6. Similarly, the transistor P4 includes a drain terminal coupled to the drain terminal of the transistor P2, a gate terminal coupled to the drain terminal of the transistor P2, and a source terminal coupled to the first voltage rail. The transistor P6 includes a gate terminal coupled to the drain terminal of the transistor P2, a drain terminal coupled to a drain terminal of the transistor N6, and a source terminal coupled to the first voltage rail. The transistor N6 includes a source terminal coupled to the second voltage rail, and a gate terminal coupled to the gate terminal of the transistor N5.

In one aspect, the transistors P3, P5, N5, N6 operate together to pull down the bias control signal 480 in response to a current through the input A being larger than a current through the input B, and the transistors P4, P6 operate together pull up the bias control signal 480 in response to the current through the input A being less than the current through the input B. For example, the transistors P3, P5 operate as a current mirror circuit that mirrors the current through the input A to generate current through the transistors P5, N5. Similarly, the transistors N3, N5 operate as a current mirror circuit that mirrors the current through the transistor N5 to generate a current through the transistors N6 to pull down the bias control signal 480. Moreover, the transistors P4, P6 operate as a current mirror circuit that mirrors the current through the input B to generate a current through the transistors P6 to pull up the bias control signal 480. Accordingly, the bias control signal 480 can increase or decrease, according to current through the input A, input B.

Figure 9:
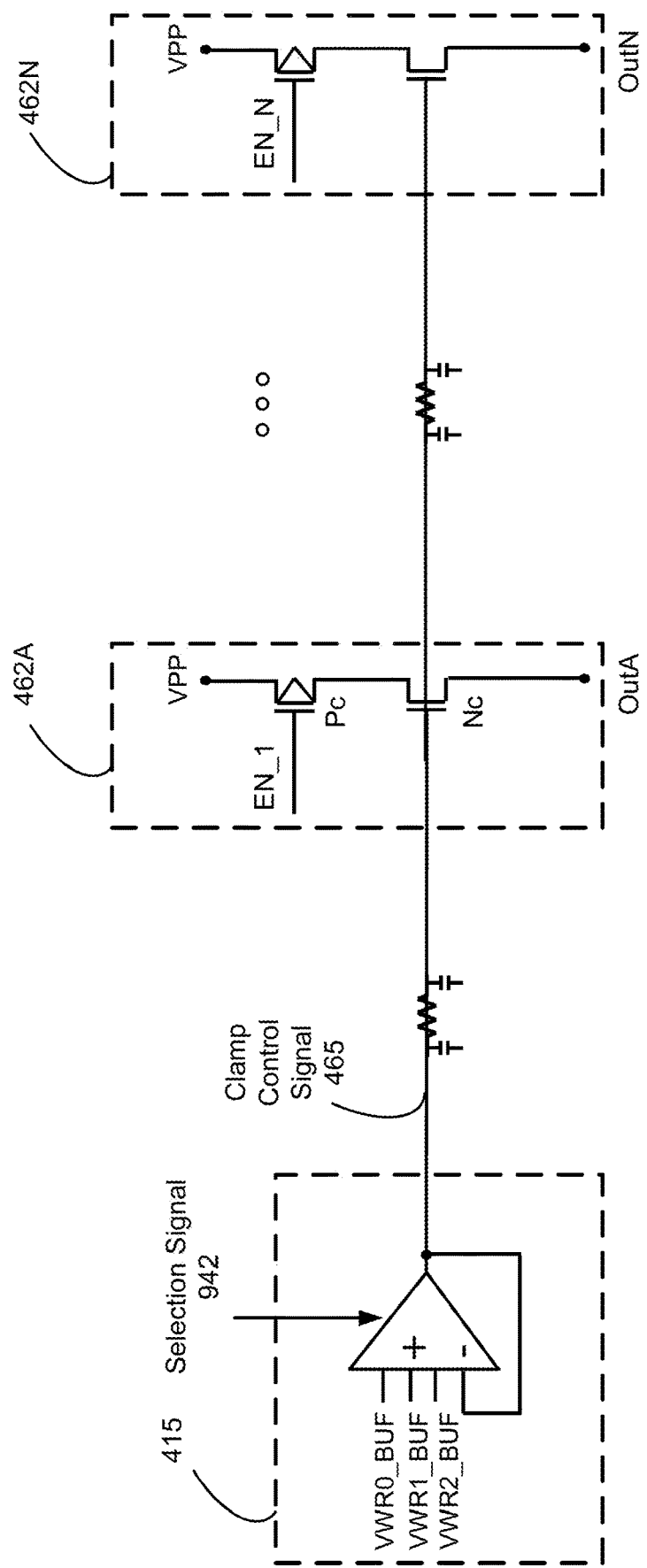
FIG. 9 is an example circuit diagram of a clamp control circuit and clamp circuits according to an example embodiment.

Referring FIG. 9, illustrated is an example circuit diagram of a clamp control circuit 415 and clamp circuits 462 according to an example embodiment. In some embodiments, the clamp control circuit 415 is coupled to a plurality of clamp circuits 462A . . . 462N, where each clamp circuit 462 is coupled to an output of a corresponding distributed driver 460. These components may operate together to source or sink current to help voltages output from the distributed drivers 460 to settle.

In one implementation, the clamp control circuit 415 includes a unity gain buffer that receives input voltages VWR0_BUF, VWR1_BUF, VWR2_BUF, and generates a clamp control signal 465 according to one of the received input voltages VWR0_BUF, VWR1_BUF, VWR2_BUF. The input voltages VWR0_BUF, VWR1_BUF, VWR2_BUF are target voltages of the voltage (e.g., VWR) output from the distributed drivers 460 with different DC levels. The input voltages VWR0_BUF, VWR1_BUF, VWR2_BUF may correspond to voltage levels VWR0, VWR1, VWR2 of FIG. 5, respectively. The input voltages VWR0_BUF, VWR1_BUF, VWR2_BUF may be generated by a driving circuit (e.g., stripe controller 170). In one aspect, the clamp control circuit 415 receives a selection signal 942, and causes the voltage of the clamp control signal 465 to follow a voltage of a selected input voltage according to the selection signal 942. The selection signal 942 is a signal that indicates a selected voltage level of the clamp control signal 465. The selection signal 942 may be generated by a driving circuit (e.g., stripe controller 170). The selection signal 942 may select different voltage levels at different time periods. The clamp control circuit 415 may generate the clamp control signal 465 with different voltage levels selected from the input voltage voltages VWR0_BUF, VWR1_BUF, VWR2_BUF at different time periods according to the selection signal 942.

In one implementation, the clamp circuit 462X includes a P-type transistor Pc and an N-type transistor Nc. In other embodiments, some of N-type transistors of the clamp circuit 462 shown in FIG. 9 may be implemented by P-type transistors, and some of P-type transistors of the clamp circuit 462 shown in FIG. 9 may be implemented by N-type transistors. The transistor Nc includes a drain terminal coupled to a drain terminal of the transistor Pc, a gate terminal coupled to the clamp control circuit 415 to receive the clamp control signal 465, and a source terminal coupled to an output terminal OutX. The output terminal OutX is a terminal, node, or a port coupled to an output of the corresponding distributed driver 460X. The transistor Pc includes a source terminal coupled to the first voltage rail, a drain terminal coupled to a drain terminal of the transistor Nc, and a gate terminal coupled to a conductive line for receiving a signal EN_X. The signal EN_X is a signal for enabling or disabling the clamp circuit 462X. For example, in response to the signal EN_X having a voltage corresponding to logic '0' applied to the gate terminal of the transistor Pc, the transistor Pc is enabled to allow the transistor Nc to conduct current, and in response to the signal EN_X having a voltage corresponding to logic '1' applied to the gate terminal of the transistor Pc, the transistor Pc is disabled to prevent the transistor Nc from conducting current. According to the signal EN_X, different clamp circuits 462 can be selectively configured to supply current to output of the corresponding distributed drivers 460.

In this configuration, when the transistor Pc is enabled, the transistor Nc may sense the voltage (e.g., VWR) at the output terminal OutX, and supply current to the output terminal OutX, according to a difference between the voltage of the clamp control signal 465 and the voltage (e.g., VWR) at the output terminal OutX. For example, if the difference between the voltage of the clamp control signal 465 and the voltage (e.g., VWR) at the output terminal OutX is larger than a threshold voltage of the transistor Nc, the transistor Nc supplies current to the output terminal OutX. The current supplied to the output terminal OutX may cause the voltage (e.g., VWR) at the output terminal OutX to increase until the difference between the voltage of the clamp control signal 465 and the voltage (e.g., VWR) at the output terminal OutX becomes less than the threshold voltage of the transistor Nc, at which the transistor Nc is turned off to stop conducting current. By implementing the clamp circuit 462, the voltage (e.g., VWR) at the output of the distributed driver 460 may settle in a prompt manner, despite of a large change in the voltage at the output of the distributed driver 460 or large sink current.

Figure 10:
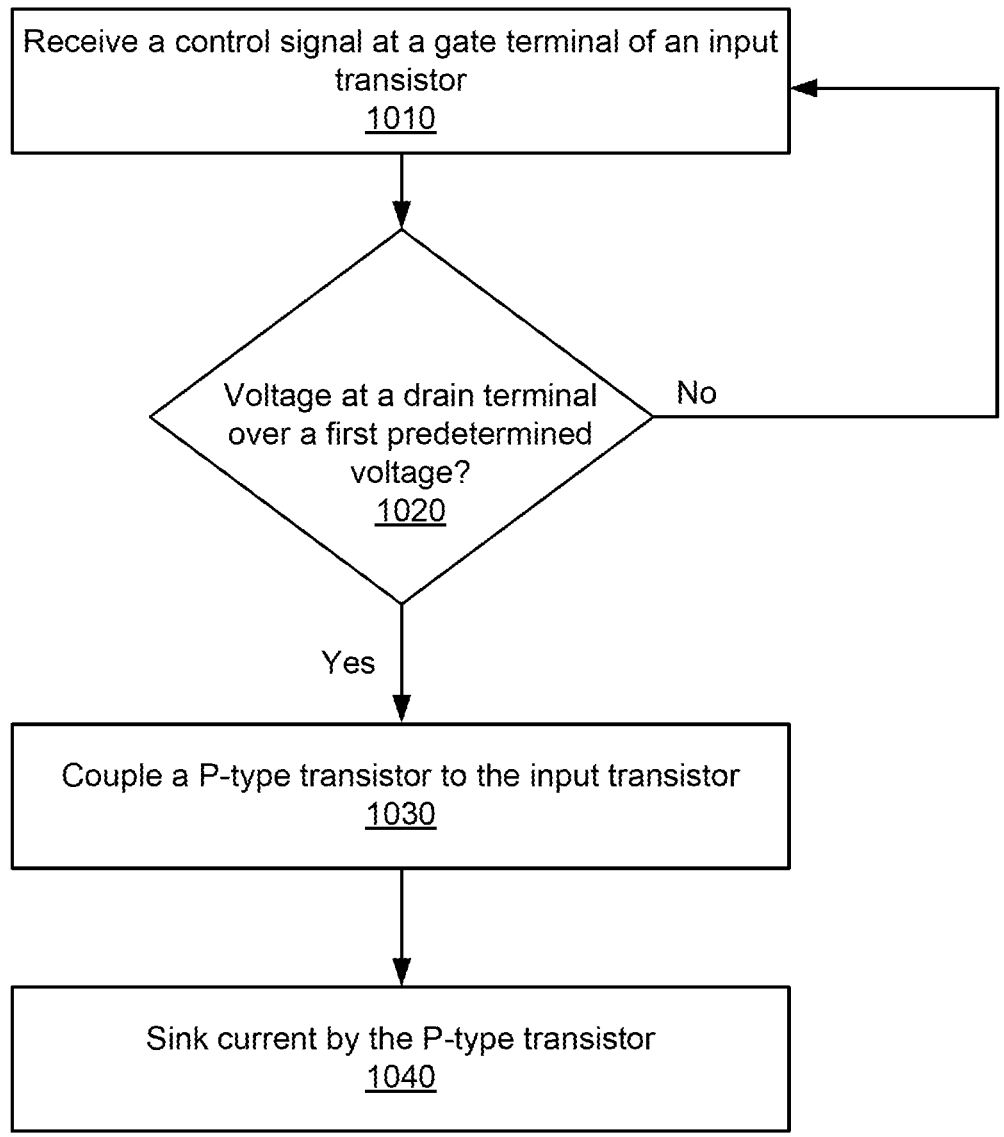
FIG. 10 is an example flow chart illustrating a process of automatically sinking current at a memory cell according to an example embodiment.

Referring to FIG. 10, illustrated is an example flow chart illustrating a process 1000 of automatically sinking current at a memory cell, according to an example embodiment. The process 1000 may be performed by the driving circuit 640 and the self-controlled current circuit 680 of FIGS. 6 and 7. In other embodiments, the process 1000 may be performed by other components. In other embodiments, the process 1000 may include more, fewer, or different steps than shown in FIG. 10.

The driving circuit 640 receives a control signal (e.g., bias control signal 480) at a gate terminal of an input transistor (e.g., transistor M5) of the driving circuit 640 in step 1010. The control signal is a signal indicative of a target voltage of an output of the driving circuit 640.

The self-controlled current circuit 680 determines whether a voltage at a drain terminal (or a voltage at the node NN of the driving circuit 640) of the input transistor (e.g., transistor M5) satisfies a first predetermined voltage in step 1020. Satisfying a first predetermined voltage may include the voltage at the drain terminal of the input transistor being equal to or greater than the first predetermined voltage. In one approach, a voltage at a gate terminal of the input transistor (e.g., transistor M5) affects a drain terminal of the input transistor (e.g., transistor M5). For example, a decrease in a voltage at the control signal causes an increase at a drain terminal of the input transistor (e.g., transistor M5). The drain terminal of the input transistor (e.g., transistor M5) may be coupled to a gate terminal of the transistor M10 of the self-controlled current circuit 680, such that the transistor M10 can detect a voltage at the drain terminal of the input transistor (e.g., transistor M5). If the voltage at the drain terminal of the input transistor (e.g., transistor M5) does not satisfy the first predetermined voltage (e.g., less than the first predetermined voltage), the process 1000 returns to the step 1010. The first predetermined voltage may be a sum of a voltage (e.g., VREF) of the gate terminal of the P-type transistor (e.g., transistor M9), a threshold voltage of the P-type transistor (e.g., transistor M9), and a threshold voltage of the transistor M10.

If the voltage at the drain terminal of the input transistor (e.g., transistor M5) satisfies the first predetermined voltage (e.g., larger than the first predetermined voltage), the transistor M10 of the self-controlled current circuit 680 couples the P-type transistor (e.g., transistor M9) to a source terminal of the input transistor (e.g., transistor M5) in step 1030. The P-type transistor (e.g., transistor M9) sinks current from the source terminal of the input transistor in step 1040, until a voltage at the source terminal of the input transistor (e.g., transistor M5) is below a second predetermined voltage. The second predetermined voltage may be a sum of the voltage (e.g., VREF) of the gate terminal of the P-type transistor (e.g., transistor M9) and a threshold voltage of the P-type transistor (e.g., transistor M9).

Advantageously, the self-controlled current circuit 680 can automatically sink a large amount of current at the output terminal of the driving circuit 640 until the voltage VWR reaches a predetermined voltage (e.g., a sum of the voltage VREF and a threshold voltage of the transistor M9).

Figure 11:
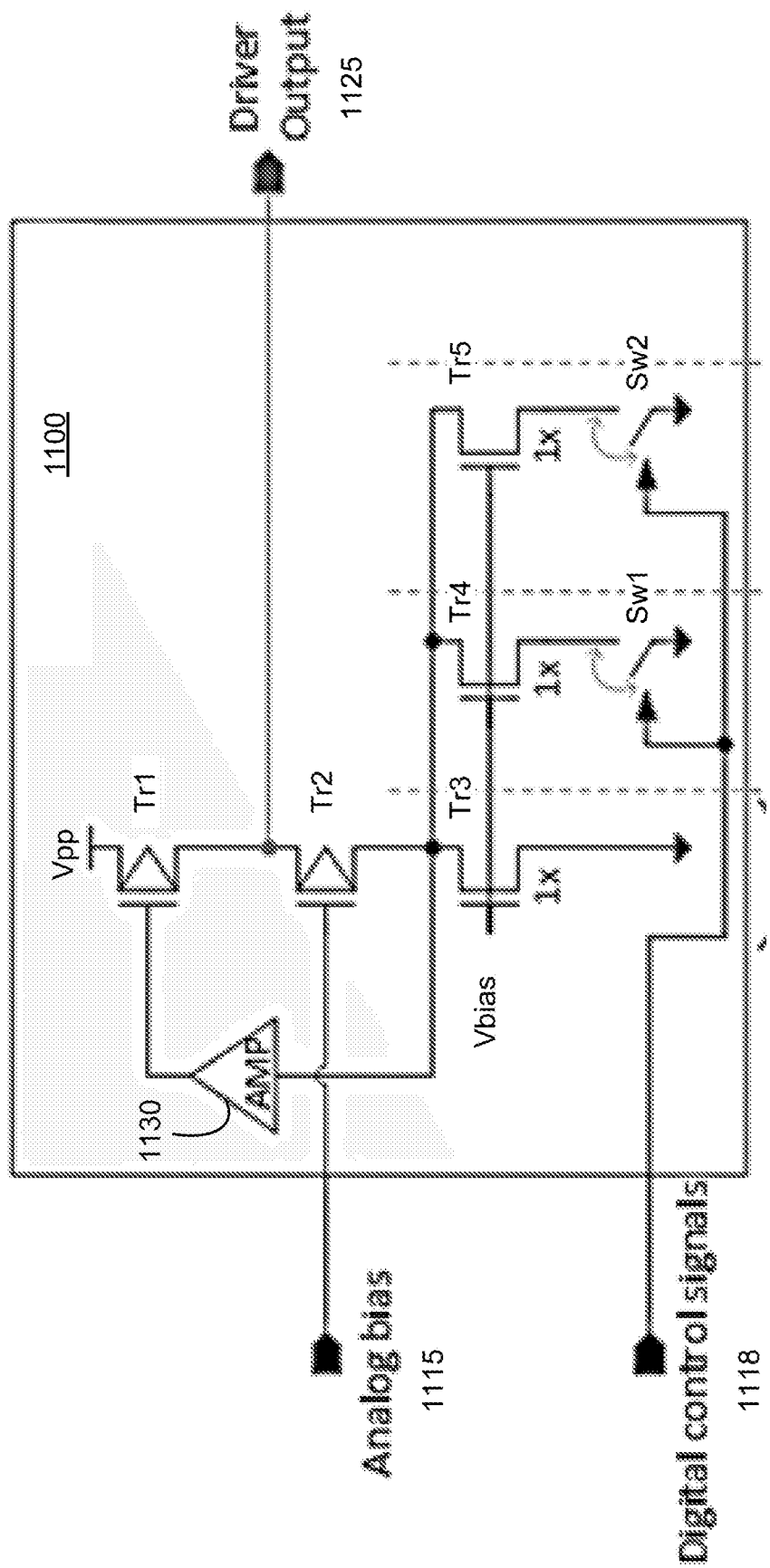
FIG. 11 is an example circuit diagram of a driving circuit according to an example embodiment.

Referring to FIG. 11, illustrated is an example circuit diagram of a driving circuit 1100 according to an example embodiment. The driving circuit 1100 may be part of the stripe controller 170 or the bay controller 175 to provide various signals to memory cells. In some embodiments, the driving circuit 1100 includes an amplifier circuit 1130, transistors Tr1-Tr5, and switches Sw1, Sw2. The transistors Tr1, Tr2 may be P-type transistors, and the transistors Tr3-Tr5 may be N-type transistors. These components operate together to receive an analog bias 1115 and digital control signals 1118, and generate a driver output 1125 according to the analog bias 1115 and the digital control signals 1118. The analog bias 1115 is a signal indicative of a target output of the driver output 1125. The digital control signals 1118 are signals for configuring settings of the driving circuit 1100. For example, the digital control signals 1118 indicate an operation speed or a power consumption of the driving circuit 1100. The analog bias 1115 and the digital control signals 1118 may be generated by the stripe controller 170. The driver output 1125 is a signal for operating memory cells. In one example, the driver output 1125 may be the signal VGWL to drive the switch $S_{WL}$ or the signal VWG to drive the switch $S_{GBL}$ of FIG. 2. In other embodiments, the driving circuit 1100 includes more, fewer, or different components than shown in FIG. 11. In other embodiments, some of P-type transistors shown in FIG. 11 may be implemented by N-type transistors, and some of N-type transistors shown in FIG. 11 may be implemented by P-type transistors.

In one configuration, the transistor Tr1 includes a source terminal coupled to the first voltage rail to receive the supply voltage Vpp, a gate terminal coupled to an output terminal of the amplifier circuit 1130, and a drain terminal coupled to the source terminal of the transistor Tr2. A voltage at the drain terminal of the transistor Tr1 may be output as the driver output 1125. The transistor Tr2 includes a gate terminal coupled to a conductive line to receive the analog bias 1115, and a drain terminal coupled to drain terminals of the transistors Tr3, Tr4, Tr5 and an input terminal of the amplifier circuit 1130. The transistor Tr3 includes a source terminal coupled to a second voltage rail to receive the ground voltage GND, and a gate terminal coupled to a conductive line to receive a signal Vbias. The signal Vbias is a signal indicative of a target amount of current flowing through the transistor Tr3. The signal Vbias may be generated by the stripe controller 170. The transistor Tr4 includes a gate terminal coupled to the conductive line to receive the signal Vbias, and a source terminal coupled to the switch Sw1. Similarly, the transistor Tr5 includes a gate terminal coupled to the conductive line to receive the signal Vbias, and a source terminal coupled to the switch Sw2. The switches Sw1, Sw2 may be embodied as transistors.

In this configuration, the driving circuit 1100 receives the analog bias 1115, and generates the driver output 1125 according to the analog bias 1115 and current supplied from one or more of the transistors Tr3, Tr4, Tr5. Current supplied by the transistors Tr3, Tr4, Tr5 may be determined according to the digital control signals 1118. For example, in response to a digital signal (e.g., a voltage corresponding to logic '1') applied to a gate terminal of the switch Sw1, the switch Sw1 electrically couples the source terminal of the transistor Tr4 to the second voltage rail to allow the transistor Tr4 to conduct current, and in response to a digital signal (e.g., a voltage corresponding to logic '0') applied to a gate terminal of the switch Sw1, the switch Sw1 electrically decouples the source terminal of the transistor Tr4 from the second voltage rail to not allow the transistor Tr4 to conduct current. The switch Sw2 and the transistor Tr5 operate in a similar manner with respect to the switch Sw1 and the transistor Tr4. By supplying additional current, the operating speed of the driving circuit 1100 may improve, but consume additional power. Ability to control settings of the driving circuit 1100 through the digital control signals 1118 allows flexible configuration of the driving circuit 1100 depending on the power consumption or speed requirements.

Figure 12:
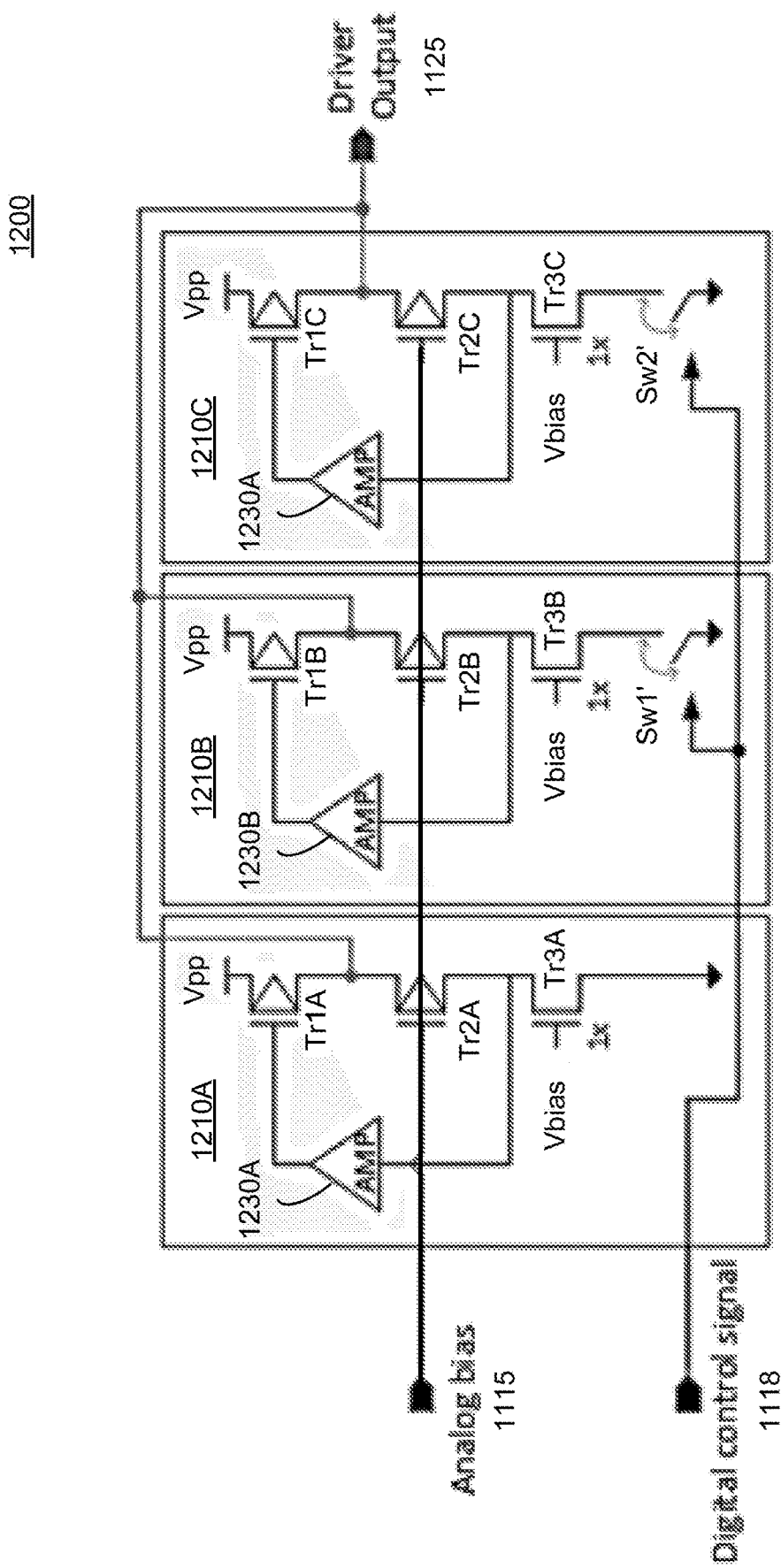
FIG. 12 is an example circuit diagram of another driving circuit according to an example embodiment.

Referring to FIG. 12, illustrated is an example circuit diagram of another driving circuit 1200 according to an example embodiment. The driving circuit 1200 includes modular driving circuits 1210A, 1210B, 1210C, where outputs of the modular driving circuits 1210A, 1201B, 1210C are coupled in parallel between the input terminal of the driving circuit 1200 to receive the analog bias 1115 and the output terminal of the driving circuit 1200 to output the driver output 1125. A modular driving circuit is a circuit that itself is operable as a single driving circuit. In one approach, the modular driving circuit 1210A is identical to a portion of the driving circuit 1100 including the transistors Tr1-Tr3 and the amplifier circuit 1130. The modular driving circuit 1210B is similar to the modular driving circuit 1210A except the switch Sw1' is added in series between the Tr3B and the second voltage rail. The modular driving circuit 1210C is similar to the modular driving circuit 1210A except the switch Sw2' is added in series between the Tr3C and the second voltage rail. The switches Sw1', Sw2' may be digitally configured to enable or disable corresponding modular driving circuits 1210, according to the digital control signal 1118. Although three modular driving circuits 1210A-C are shown in FIG. 12, in other embodiments, the driving circuit 1200 includes any number of modular driving circuits 1210.

Figure 13:
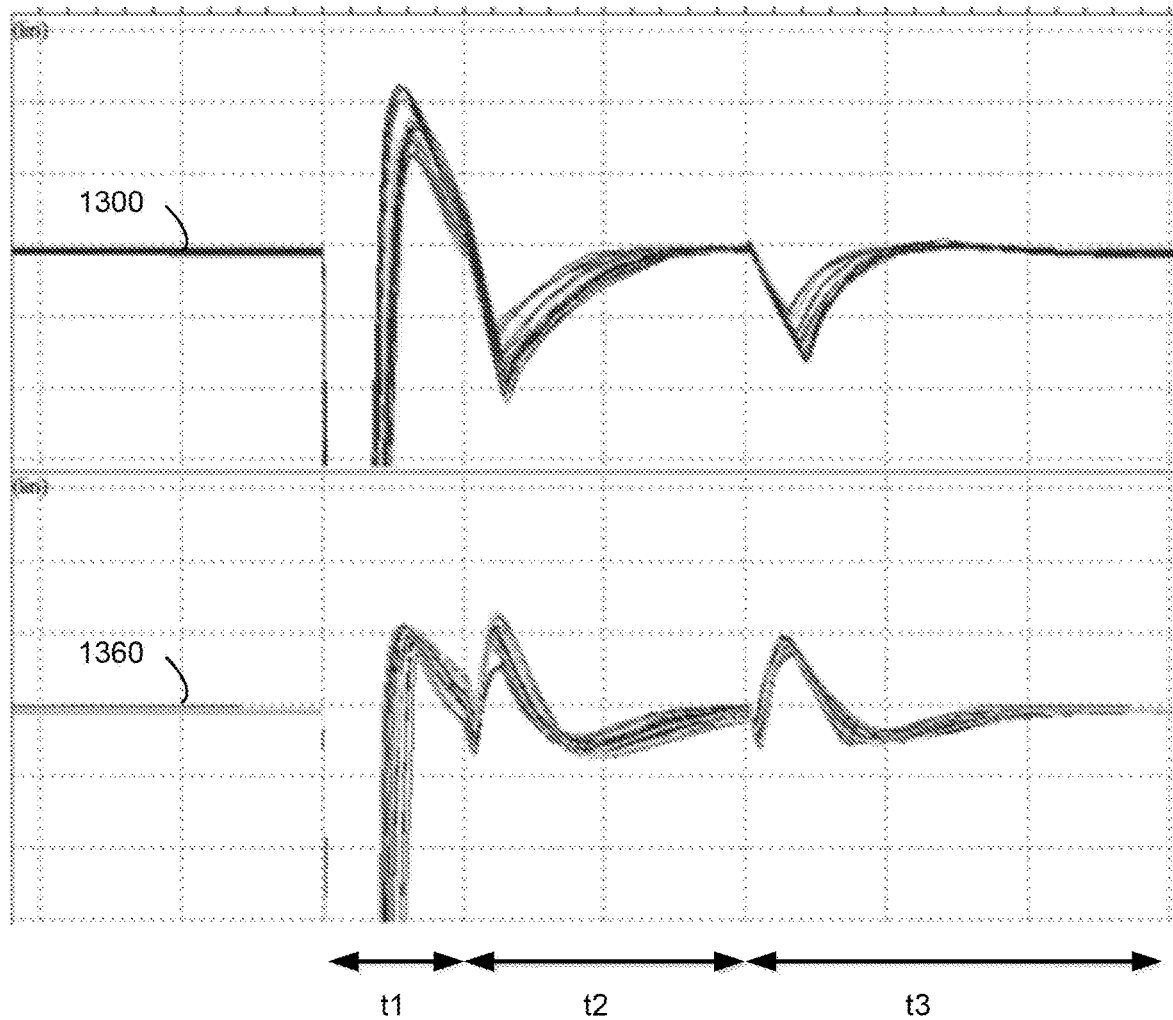
FIG. 13 illustrates example timing plots showing timing responses of different driving circuits.

Referring to FIG. 13, illustrated are example timing plots 1300, 1360 showing timing responses of different driving circuits 1100, 1200. The plot 1300 shows a voltage at the driver output 1125 of the driving circuit 1100 in response to perturbations at different time periods t1, t2, t3 with different settings. Specifically, for the driving circuit 1100, the time period t1 corresponds to when transistors Tr3-Tr5 are enabled, the time period t2 corresponds to when transistors Tr3, Tr4 are enabled, and time period t3 corresponds to when only the transistor Tr3 is enabled. The plot 1360 shows a voltage at the driver output 1125 of the driving circuit 1200 in response to perturbations at the different time periods t1, t2, t3 with different settings. For the driving circuit 1200, the time period t1 corresponds to when the modular driving circuits 1210A-1210C are enabled, the time period t2 corresponds to the modular driving circuits 1210A, 1210B are enabled, and time period t3 corresponds to when only the modular driving circuit 1210A is enabled. Generally, lower current supplied to the driving circuits 1100, 1200 renders longer time consumed to allow the voltage at the driver output 1125 to settle.

As shown in FIG. 13, employing the modular driving circuits 1210 as shown in FIG. 12 rather than adding configurable current sources (e.g., transistors Tr4, Tr5 and switches Sw1, Sw2 of FIG. 11) with shared circuits (e.g., transistors TR1, TR2, and amplifier circuit 1130) allows reduced peaking at the driver output 1125. In particular, the peaking of the driver output of the driving circuit 1100 is almost twice as large as the peaking of the driver output of the driving circuit 1200 by employing the modular driving circuits 1210. Accordingly, the lower peaking of the driver output of the driving circuit 1200 enables more stable voltage to be provided to memory cells.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a current source;
   an input transistor coupled to the current source in series, wherein the input transistor includes:
      a drain terminal coupled to the current source and the switch transistor, and
      a gate terminal to receive a control signal, the input transistor to change the voltage at the source terminal by changing a voltage at the drain terminal of the input transistor and subsequently changing a voltage at the gate terminal of the diode connected transistor according the control signal;
   a switch transistor coupled to the input transistor in parallel and coupled to the current source in series;
   a diode connected transistor having a gate terminal coupled to the switch transistor;
   a mirroring transistor coupled to the input transistor and the current source in series, the mirroring transistor having a gate terminal coupled to the gate terminal of the diode connected transistor, wherein a voltage at a source terminal of the input transistor is supplied to a corresponding memory cell;
   P-type transistor; and
   a control switch configured to:
      couple the source terminal of the input transistor to a source terminal of the P-type transistor, in response to the voltage at the drain terminal of the input transistor being over a first predetermined voltage, and
      decouple the source terminal of the input transistor from the source terminal of the P-type transistor, in response to the voltage at the source terminal of the input transistor being below the first predetermined voltage.

2. The device of claim 1, wherein, while the source terminal of the P-type transistor is coupled to the source terminal of the input transistor, the P-type transistor is configured to:
   sink current from the source terminal of the input transistor, in response to the voltage at the source terminal of the input transistor being over a second predetermined voltage.

3. The device of claim 1, further comprising:
   an amplifier circuit having an output coupled to the gate terminal of the input transistor, the amplifier circuit to generate the control signal.

4. The device of claim 3, further comprising:
   an additional current source;
   an additional input transistor coupled to the additional current source in series, the additional input transistor having a source terminal coupled to an input of the amplifier circuit;
   an additional switch transistor coupled to the additional input transistor in parallel and coupled to the additional current source in series;
   an additional diode connected transistor having a gate terminal coupled to the additional switch transistor; and
   an additional mirroring transistor coupled to the additional input transistor and the additional current source in series, the additional mirroring transistor having a gate terminal coupled to the gate terminal of the additional diode connected transistor.

5. The device of claim 3, where the amplifier circuit is configured to output one of at least three voltage levels.

6. The device of claim 5, where the amplifier circuit includes:
   a shared load circuit, and
   a plurality of differential sensing circuits coupled to each other in parallel, each of the plurality of differential sensing circuits coupled to the shared load circuit in series.

* * * * *